(12) United States Patent
Gutierrez

(10) Patent No.: US 7,477,842 B2
(45) Date of Patent: Jan. 13, 2009

(54) MINIATURE CAMERA

(75) Inventor: Roman C. Gutierrez, Arcadia, CA (US)

(73) Assignee: Siimpel, Inc., Arcadia, CA (US)

( * ) Notice: Subject to any disclaimer, the term of this patent is extended or adjusted under 35 U.S.C. 154(b) by 116 days.

(21) Appl. No.: 11/078,667

(22) Filed: Mar. 11, 2005

(65) Prior Publication Data

US 2005/0249487 A1    Nov. 10, 2005

Related U.S. Application Data

(60) Provisional application No. 60/552,521, filed on Mar. 12, 2004.

(51) Int. Cl.
  *G03B 13/34* (2006.01)
  *G02B 7/02* (2006.01)
(52) U.S. Cl. ........................ 396/133; 359/823
(58) Field of Classification Search ................ 396/72, 396/85, 79, 133; 359/823; 310/309
  See application file for complete search history.

(56) References Cited

U.S. PATENT DOCUMENTS

| | | | |
|---|---|---|---|
| 5,365,296 A * | 11/1994 | Murakami et al. ............ 396/80 |
| 5,563,466 A * | 10/1996 | Rennex et al. ............... 310/309 |
| 6,531,804 B2 * | 3/2003 | Kasahara ..................... 310/309 |
| 6,611,079 B2 * | 8/2003 | Koga et al. ................... 310/309 |
| 6,914,635 B2 | 7/2005 | Ostergard |
| 6,924,940 B2 * | 8/2005 | Koga et al. ..................... 359/694 |
| 7,113,688 B2 * | 9/2006 | Calvet et al. ................. 385/137 |
| 2003/0043289 A1 * | 3/2003 | Konno ......................... 348/335 |
| 2003/0076421 A1 * | 4/2003 | Dutta ..................... 348/208.11 |
| 2004/0017620 A1 * | 1/2004 | Kaneko et al. .............. 359/824 |
| 2004/0201773 A1 * | 10/2004 | Ostergard ................... 348/374 |
| 2006/0204242 A1 * | 9/2006 | Gutierrez et al. ............ 396/439 |

OTHER PUBLICATIONS

Akihiro Koga et al.; "Electrostatic Linear Microactuator Mechanism for Focusing a CCD Camera"; Journal of Lightwave Technology, vol. 17, No. 1; p. 43-47; Jan. 1999.

* cited by examiner

*Primary Examiner*—W. B. Perkey
(74) *Attorney, Agent, or Firm*—Don C. Lawrence; MacPherson Kwok Chen & Heid LLP

(57) ABSTRACT

In accordance with an embodiment of the present invention, a miniature camera has a first stage and a first optical element formed to the first stage. A motion control assembly is configured to provide movement of the first stage in one degree of freedom while inhibiting movement of the stage in five degrees of freedom, so as to facilitate at least one of focusing and zooming the camera.

45 Claims, 20 Drawing Sheets

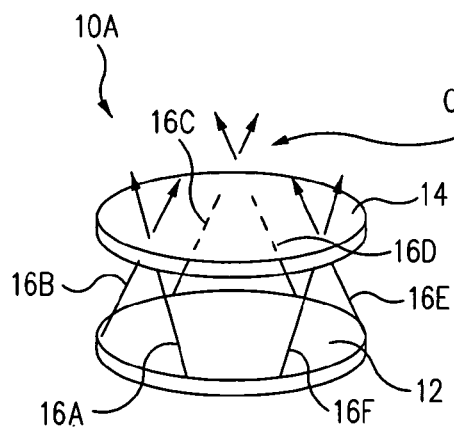
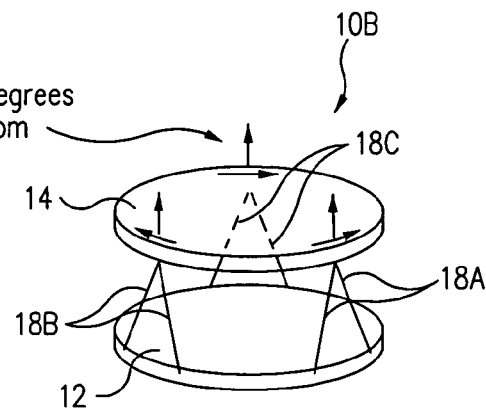
FIG. 1A
FIG. 1B
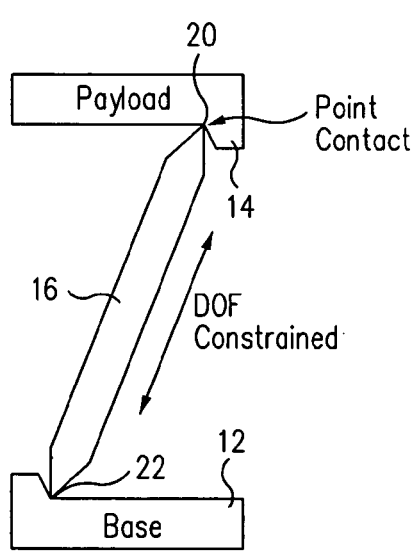
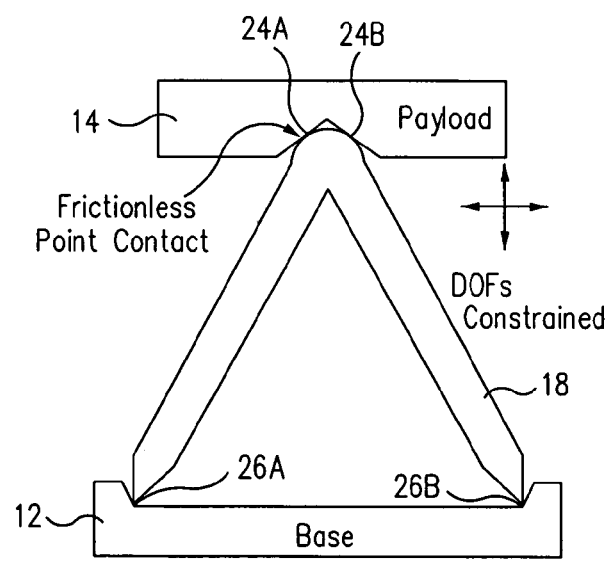
FIG. 2A
FIG. 2B

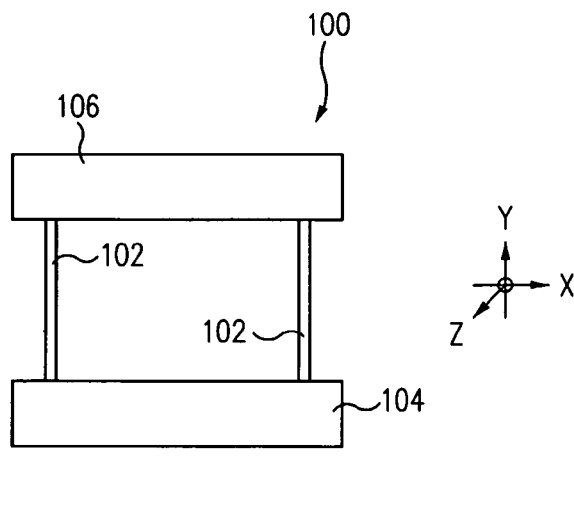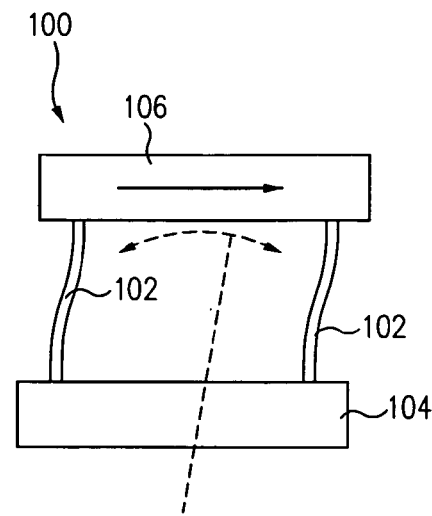
FIG. 10A
(PRIOR ART)
FIG. 10B
(PRIOR ART)
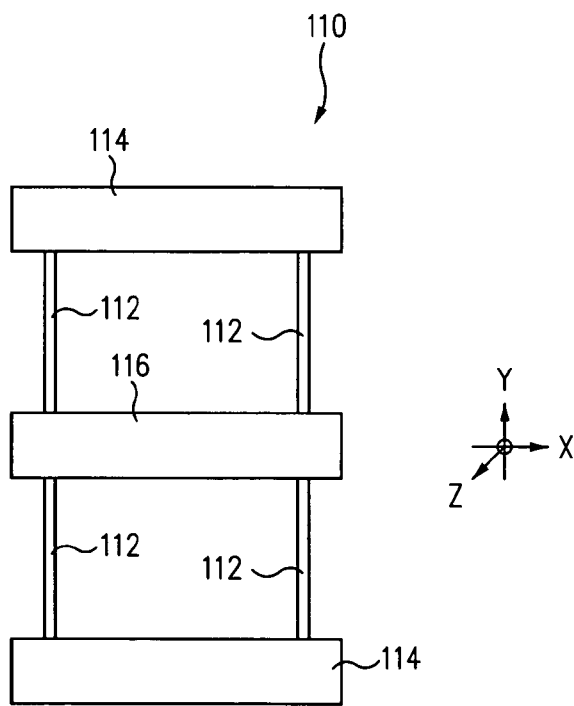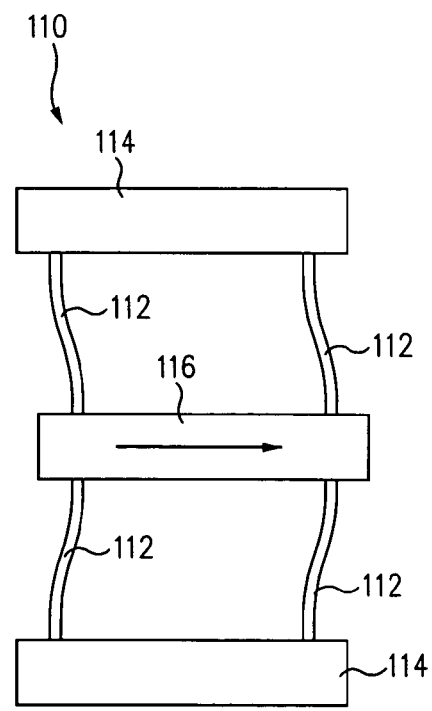
FIG. 11A
(PRIOR ART)
FIG. 11B
(PRIOR ART)

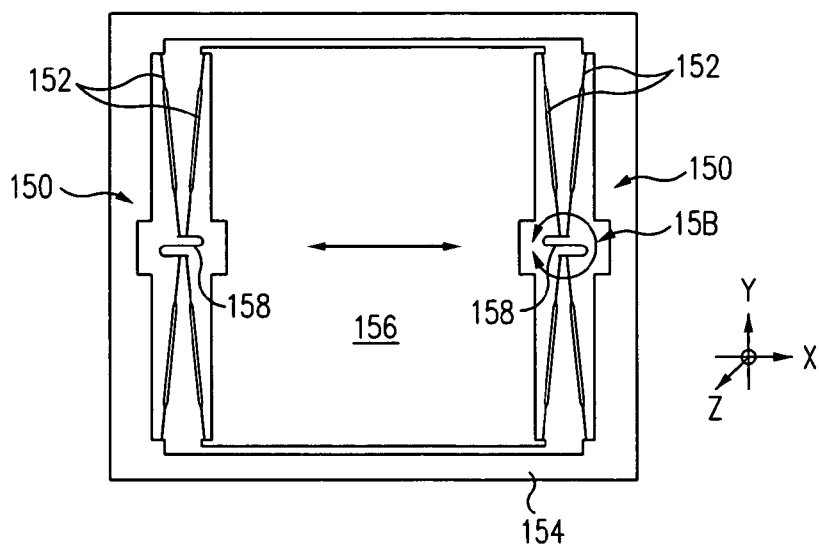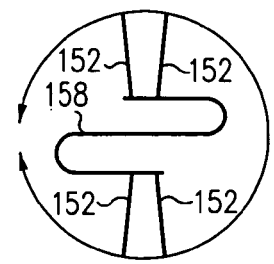
FIG. 15A
FIG. 15B
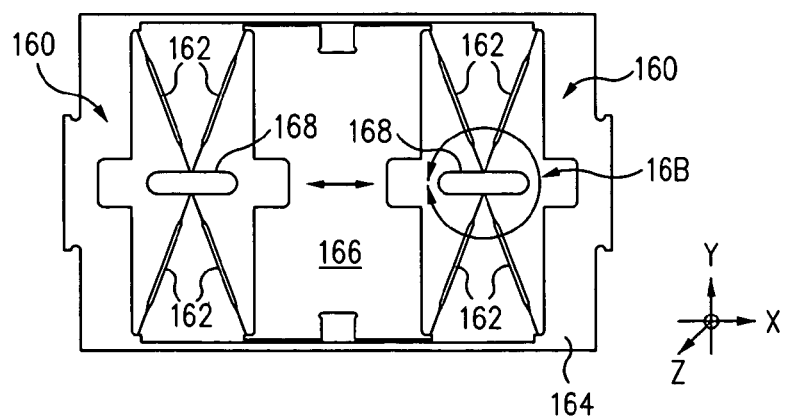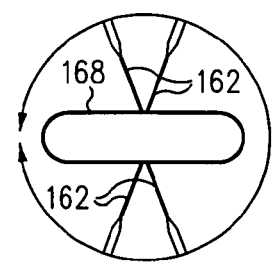
FIG. 16A
FIG. 16B

MINIATURE CAMERA

PRIORITY CLAIM

This patent application claims the benefit of the priority date of U.S. Provisional Patent Application Ser. No. 60/552, 521, filed on Mar. 12, 2004 and entitled Miniature Camera pursuant to 35 USC 119. The entire contents of this provisional patent application are hereby expressly incorporated by reference.

RELATED APPLICATIONS

This patent application expressly incorporates by reference the entire contents of U.S. patent application Ser. No. 11/041, 122, filed on Jan. 21, 2005 and entitled Motion Control Stages and Method of Making the Same.

TECHNICAL FIELD

The present invention relates generally to digital imaging. The present invention relates more particularly to a miniature camera having at least one stage that is moved by an actuator, such as a micro electromechanical system (MEMS) actuator, so as to provide such features as variable focus, optical zoom, and/or image stabilization, such that the camera is suitable for use in small devices such as cellular telephones.

BACKGROUND

Digital cameras are well known. As their cost continues to drop, digital cameras grow in popularity. Digital cameras eliminate the need to have film developed. They also greatly reduce the need to have prints made, since digital pictures can be viewed on a computer monitor or the like. Although the initial cost may be higher, digital cameras have greatly reduced the overall cost of photography.

It has been estimated that about 100 billion photographs are taken each year world-wide. The use of digital cameras is expected to exceed the use of film cameras for the first time in 2004.

Digital cameras have widespread applications. Digital cameras can be used in both amateur and professional photography. They can also be used in various industrial applications, such as machine vision.

One rapidly growing application for digital cameras is their use in cellular telephones. Camera phones outsold other digital cameras for the first time in the last quarter of 2003. Camera phones allow pictures to be quickly and conveniently shared with others. Images can be captured at the spur of the moment and almost instantaneously communicated to other cellular telephone users and to the Internet.

Although such contemporary camera phones have proven generally suitable for their intended purposes, they possess inherent deficiencies that detract from their overall effectiveness and desirability. For example, contemporary digital cameras commonly have features such as variable focus, optical zoom, and image stabilization. However, contemporary camera phones do not have these desirable features. Contemporary variable focus mechanisms, contemporary zoom mechanisms, and contemporary image stabilization systems are simply too bulky for today's compact camera phones.

Contemporary camera phones have fixed focuses. Although a fixed focus is generally adequate under good lighting conditions, a fixed focus does not perform well when lighting is not so good such as in low light conditions. A fixed focus mechanism approximates a pinhole lens to provide sufficient depth of field as to remain in focus, at least to some degree, regardless of the distance between the subject and the camera. However, such a stopped-down lens is undesirably sensitive to ambient lighting conditions. This is because the near pinhole lens of a fixed focus camera does not admit much light. Thus, such fixed focus cameras generally require more light than variable focus cameras.

When there is insufficient ambient lighting, the image tends to appear undesirably dark. In recognizing the limitations of contemporary camera phones using such fixed focus lenses, the prior art has provided flash mechanisms to insure that adequate light is provided. However, cellular telephones use battery power supplies, and thus have limited power available for the use of such flash mechanisms. More frequent used of the flash to take photographs thus results in the need to more frequently charge the camera phone. Of course, frequent recharging is undesirable.

Although contemporary camera phones may have digital zooms, optical zooms are much preferred instead of digital zooms. As those skilled in the art will appreciate, digital zooms rapidly degrade an image as more magnification is employed. With a digital zoom, as the image becomes larger, it pixelates and loses definition. Optical zooms, on the other hand, do not degrade an image in this manner. However, the components of contemporary optical zoom assemblies, such as motors, gears, metal rods, and springs, are too bulky for use in compact camera phones.

One reason why contemporary camera phones lack autofocus and zoom features is because of the way in which contemporary movable lens are mounted. Contemporary movable lens are mounted in lens barrels or similar structures that surround the lens and that are simply to bulky for used in camera phones. Thus, it would be beneficial to provide a method for mounting movables lens that does not require the use of such barrel structures such that autofocus and zoom features can more readily be implemented in camera phones.

Better contemporary cameras have image stabilization. This feature substantially mitigates the undesirable effects of jitter, such as when caused by the inability to hold the camera very still during an exposure. Jitter may also be caused by other factors, such as the normal vibration of a moving vehicle when a photograph is being taken from within the vehicle.

Image stabilization systems move a camera's optics or its image sensor in a manner that tends to compensate for such jitter. However, the mechanisms that effect such movement in contemporary cameras are too bulky to be used in today's compact cellular telephones.

As such, although the prior art has recognized, to a limited extent, the desirability of providing camera phones with variable focus, optical zoom, and image stabilization, the proposed solutions have, to date, been ineffective in providing a satisfactory remedy. Therefore, it is desirable to provide a miniature camera having variable focus, an optical zoom, and/or image stabilization, wherein the camera is suitable for use in small, portable devices such as cellular telephones.

BRIEF SUMMARY

According to one aspect of the present invention, one or more movable stages use actuators to move an optical element in a miniature camera. Such movement of the optical element(s) substantially enhances the utility of the miniature camera. The actuators can either be formed by a MEMS process or can be formed by a non-MEMS process.

In one embodiment, movement of the stage effects focusing of the miniature camera. In one embodiment, movement of the stage effects zooming of the miniature camera. In one embodiment, movement of the stage effects image stabilization of the miniature camera. Any desired combination of variable focus, zoom, and image stabilization can be provided.

For variable focusing and zooming, the optical elements can comprise one or more lenses that are formed to a stage. For image stabilization, the optical elements can comprise one or more lenses and/or one or more image sensors that are formed to one or more stages. Stacked stages can be used to effect bi-directional movement of optical elements.

Various MEMS processes, such as micromachining and/or wafer level manufacturing, can be used to form the actuators. Various such MEMS processes can also be used to attach or otherwise form optical elements such as lens and image sensors to the stages.

The actuators can be used to move a stage in one degree of freedom, such as linearly, to effect focusing and/or zoom. The actuators can also be used to move a stage in two or more degrees of freedom, such as in two orthogonal linear directions or rotationally about two orthogonal axes, to effect image stabilization.

This invention will be more fully understood in conjunction with the following detailed description taken together with the following drawings.

BRIEF DESCRIPTION OF THE DRAWINGS

FIG. 1A is a perspective view of an exemplary embodiment of a kinematic support configuration in accordance with the present invention;

FIG. 1B is a perspective view of another exemplary kinematic support configuration;

FIG. 2A is an elevation view of a monopod connecting element of the kinematic support configuration of FIG. 1A;

FIG. 2B is an elevation view of a bipod connecting element of the kinematic support configuration of FIG. 1B;

FIG. 10A is a top plan view of a prior art motion control stage, before displacement of the payload relative to the stator thereof;

FIG. 10B is a top plan view of the prior art motion control stage of FIG. 10A, after displacement of the payload relative to the stator;

FIG. 11A is a top plan view of another prior art motion control stage, before displacement of the payload relative to the stators;

FIG. 11B is a top plan view of the prior art motion control stage of FIG. 11A, after displacement of the payload relative to the stators;

FIG. 15A is a top plan view of a stage assembly incorporating another exemplary embodiment of a connecting element in accordance with the present invention, in which the secondary connecting element of the flexure is shown encircled;

FIG. 15B is an enlarged detail view of the encircled secondary connecting element of the flexure of FIG. 15A;

FIG. 16A is a top plan view of a stage assembly incorporating another exemplary embodiment of a connecting element in accordance with the present invention, in which the secondary connecting element of the flexure is shown encircled;

FIG. 16B is an enlarged detail view of the encircled secondary connecting element of the flexure of FIG. 16A;

Embodiments of the present invention and their advantages are best understood by referring to the detailed description that follows. It should be appreciated that like reference numerals are used to identify like elements illustrated in one or more of the figures.

DETAILED DESCRIPTION OF THE PREFERRED EMBODIMENTS

Figure 3:
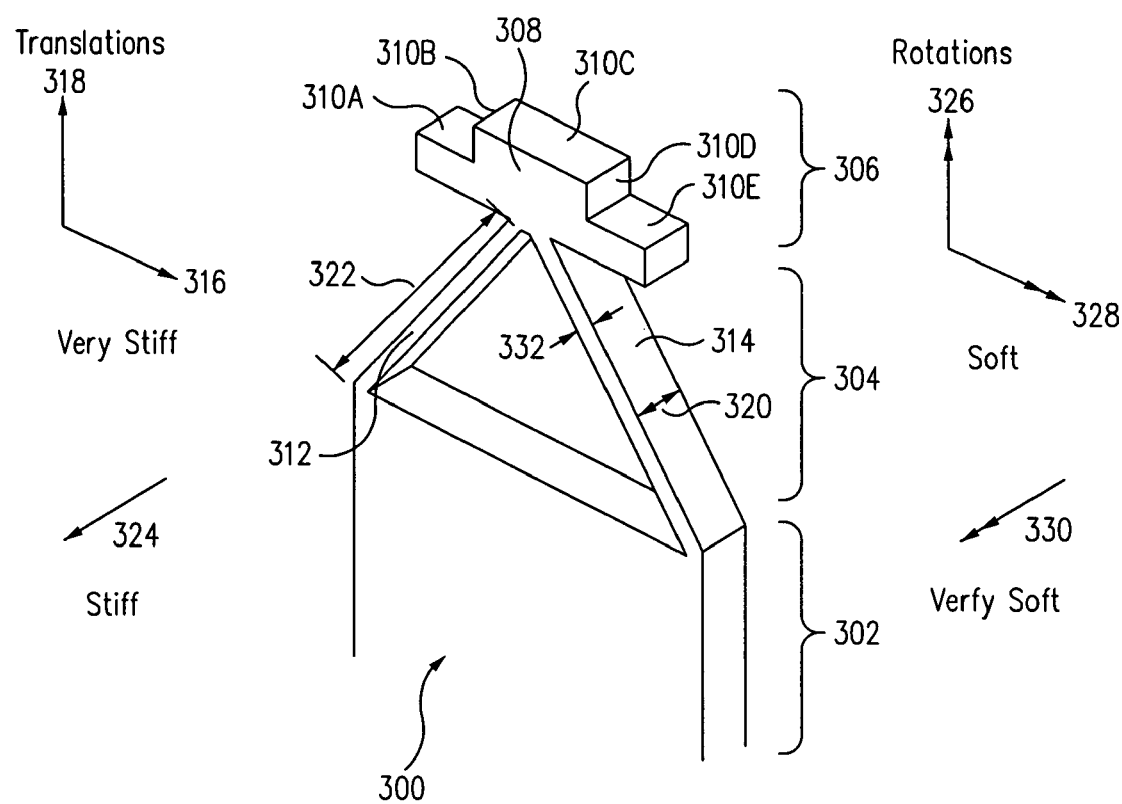
FIG. 3 is a partial perspective view of an exemplary embodiment of a stiffness control flexure system and attachment portion in accordance with the present invention.

FIG. 1A is a three-dimensional schematic view of a kinematic support configuration 10A. The kinematic support configuration 10A of FIG. 1A comprises a base assembly 12, a payload assembly 14 and six monopod connecting elements 16A-16F (individually or collectively referred to herein as "monopod connecting elements 16"). In one configuration, the base assembly 12 comprises a base support structure, and the payload assembly 14 holds or aligns an optical element, such as an optical fiber, lens or mirror. The base assembly 12 is connected to the payload assembly 14 via the six monopod connecting elements 16A-16F.

Each monopod connecting element 16 of FIG. 1A constrains one degree of freedom (hereinafter referred to as 'DOF') between the base assembly 12 and the payload assembly 104, as shown by an arrow above the kinematic support configuration 10A of FIG. 1A. A constrained DOF may be referred to as a 'stiff' DOF or a restrained DOF. The relevant reference parameter for translational stiffness or translational DOF is force, while the relevant reference parameter for rotational stiffness or rotational DOF is torque.

FIG. 1B is a three-dimensional schematic view of another kinematic support configuration 10B. The kinematic support configuration 10B of FIG. 1B comprises a base assembly 12, a payload assembly 14 and three bipod connecting elements 18A-18C (individually or collectively referred to herein as "bipod connecting element 18"). The base assembly 12 is connected to the payload assembly 14 via the three bipod connecting elements 18A-18C. Each bipod connecting element 18 constrains two DOFs between the base assembly 12 and the payload assembly 14, as shown by a pair of arrows near the kinematic support configuration 10B of FIG. 1B. In one embodiment, the kinematic support configurations 10A, 10B each have a structural path between the base assembly 12 and the payload assembly 14 in six independent DOFs, as shown by the arrows in FIGS. 1A, 1B. Six DOFs of constraint may be desired for some optic alignment applications.

The respective kinematic support configurations 10A, 10B of FIGS. 1A and 1B have the advantage of being as stiff as the respective connecting elements 16A-16F, 18A-18C, but any strain or distortion in the base assembly 12 will not be transferred to the payload assembly 14 (although a positional or attitude change may occur). Thus, any sensitive optical elements aligned within the payload assembly 14 will not be affected if applied loads or bulk temperature changes deform the base assembly 12.

Similarly, if the payload 14 grows or shrinks, there will be no forces transferred to the base assembly 12 because of the connecting elements 16A-16F, 18A-18C. But there may be a change in position or attitude between the base 12 and the payload 14. For the symmetric support configurations shown in FIGS. 1A and 1B, the only change is in the vertical direction between the two bodies 12, 14. The payload 14 may be rigidly supported and maintains position in the presence of environmental conditions, such as inertial loads.

The location of an object in space is defined by three orthogonal coordinates or vectors, and the attitude of the object is defined by three orthogonal rotations with respect to the three vectors. In accordance with the present invention, if the components of an assembly (e.g., base, payload, and connecting structure such as bipods or monopods) are formed using an extremely precise fabrication method (e.g., micromachining), then the location and attitude of a payload relative to a base may be specified as precisely by fabricating connecting structure to calculated dimensions along their support DOF(s) (e.g., a precise length for a monopod, or a precise vertical and horizontal point of contact for a bipod).

Degenerate Support

If there are fewer than six DOFs constrained between the base 12 and the payload 14, there may be some trajectory, i.e., combination of Cartesian DOFs, of the payload 14 relative to the base 12 that is unconstrained. In this case, the support between the base 12 and the payload 14 may be called "degenerate," and may occur when a connecting element 16 or 18 is missing or when certain connecting elements 16, 18 are parallel. Arbitrarily complex patterns of motion may be created or controlled by replacing one linear connecting element 16 or 18 with a linear actuator.

Redundant Support

If there are more than six DOFs constrained between the base 12 and payload 14, and the base 12 distorts or warps, there will be no solution of payload position and attitude that does not also warp the payload 14. This type of support may be called "redundant."

Redundant DOF

In some cases for both degenerate and redundant support, two or more connecting elements may constrain the same DOF. This may occur when certain connecting elements 16, 18 are constraining the payload 14 in the same way, such that removal of one of these connecting elements would not substantially affect the static position of the payload 14 with respect to the base 12. In this case, the support is said to have a "redundant DOF".

Monopods and Bipods

FIG. 2A is a partial elevation view of the monopod connecting element 16 shown in FIG. 1A. The monopod connecting element 16 of FIG. 2A constrains the base and payload assemblies 12, 14 with point contacts 20, 22 at two ends.

FIG. 2B is partial elevation view of the bipod connecting element 18 of FIG. 1B. The bipod connecting element 18 of FIG. 2B constrains the base and payload assemblies 12, 14 with one or more (ideally) frictionless point contacts 24A, 24B at one end, and two point-contacts 26A, 26B at the other end.

The DOFs restrained by the respective monopod and bipod connecting elements 16, 18 are indicated by arrows in FIGS. 2A and 2B. Six monopod connecting elements 16A-16F may constrain six DOFs between the base and payload assemblies 12, 14, as shown by the arrows in FIG. 1A. Also, three bipod connecting elements 18A-18C may constrain six different DOFs between the base and payload assemblies 12, 14, as shown by the arrows in FIG. 1B.

Both types of joints (i.e., the point-in-groove joint of FIG. 2A and the circle-in-groove joint of FIG. 2B) may be used interchangeably. A preload may be used to maintain contact between the base 12, connecting element 16 or 18, and payload 14 of FIGS. 2A and 2B.

Micromachining

The base and payload assemblies 12, 14 and the connecting elements 16A-16F, 18A-18C of FIGS. 1A, 1B, 2A and 2B may be hereinafter referred to collectively as a "micromachined passive alignment assembly" or a "micromachined assembly." Other micromachined alignment assemblies are described below. A micromachined assembly may be designed, formed and assembled using the methods described below with reference to FIGS. 7-9.

In general, each component of the micromachined assembly of FIGS. 1A, 1B, 2A and 2B may be formed by first using a patterning process, such as lithography or photolithography, to form a desired pattern on a substrate wafer. The substrate wafer may comprise silicon or another suitable material, such as gallium arsenide or germanium. The lithography process may include applying a resist on a surface of a substrate wafer, aligning a mask with a desired pattern above the substrate wafer, exposing the resist to radiation, developing the resist, and hardbaking the resist.

The radiation used for patterning the substrate wafer may include, by way of example, an ultraviolet light, an X-ray beam, or a beam of electrons. In one embodiment, the mask is made of a mechanically rigid material that has a low coefficient of thermal expansion. For example, the mask may be made of quartz, borosilicates, metallic chrome, or iron oxide. Patterning may be accomplished using either negative or positive resists. In some applications, it is desirable to use positive resists with aspect ratios above unity. In some applications, a photolithographic process is used to form a desired pattern on the substrate wafer. In a photolithography process, a photoresist such as photo-sensitive film is used in the patterning process.

After developing a pattern on the resist, one or more micromachining fabrication processes, such as Deep Reactive Ion Etching (DRIE), Wire Electric Discharge Machining (Wire EDM or WEDM), LIGA (X-Ray lithographie, galvanoformung, und abformtechnik) (X-Ray lithography, electrodeposition, and molding), or SCREAM (Single Crystal Reactive Etching and Metallization) may be used to etch the substrate wafer according to the masked pattern. In some applications, it is desirable to etch deep and straight sidewalls in the substrate wafer. In other applications, it is desirable to form a three-dimensional structure from the patterned wafer.

After etching, the patterned wafer is cleansed. The photoresist and/or resist may be removed using a solvent such as acetone. If there are other fragile MEMs structures on the wafer, a plasma etch may also be used to clean the substrate wafer.

Figure 7:
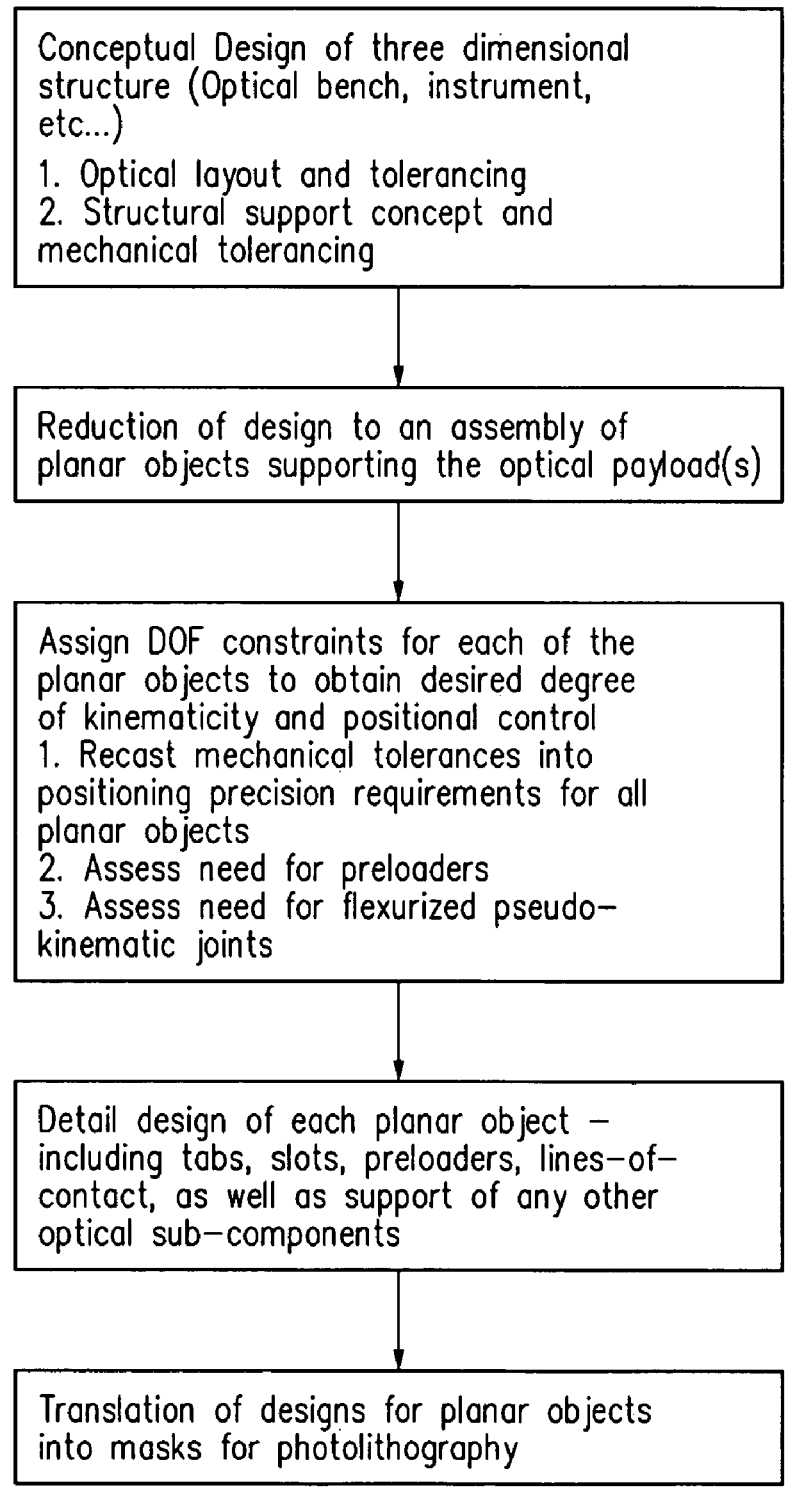
FIG. 7 is a flow chart of an exemplary method for designing the three-dimensional structures and assemblies of the present invention, and for translating such designs into masks for high precision microlithography/photolithography.
Figure 8:
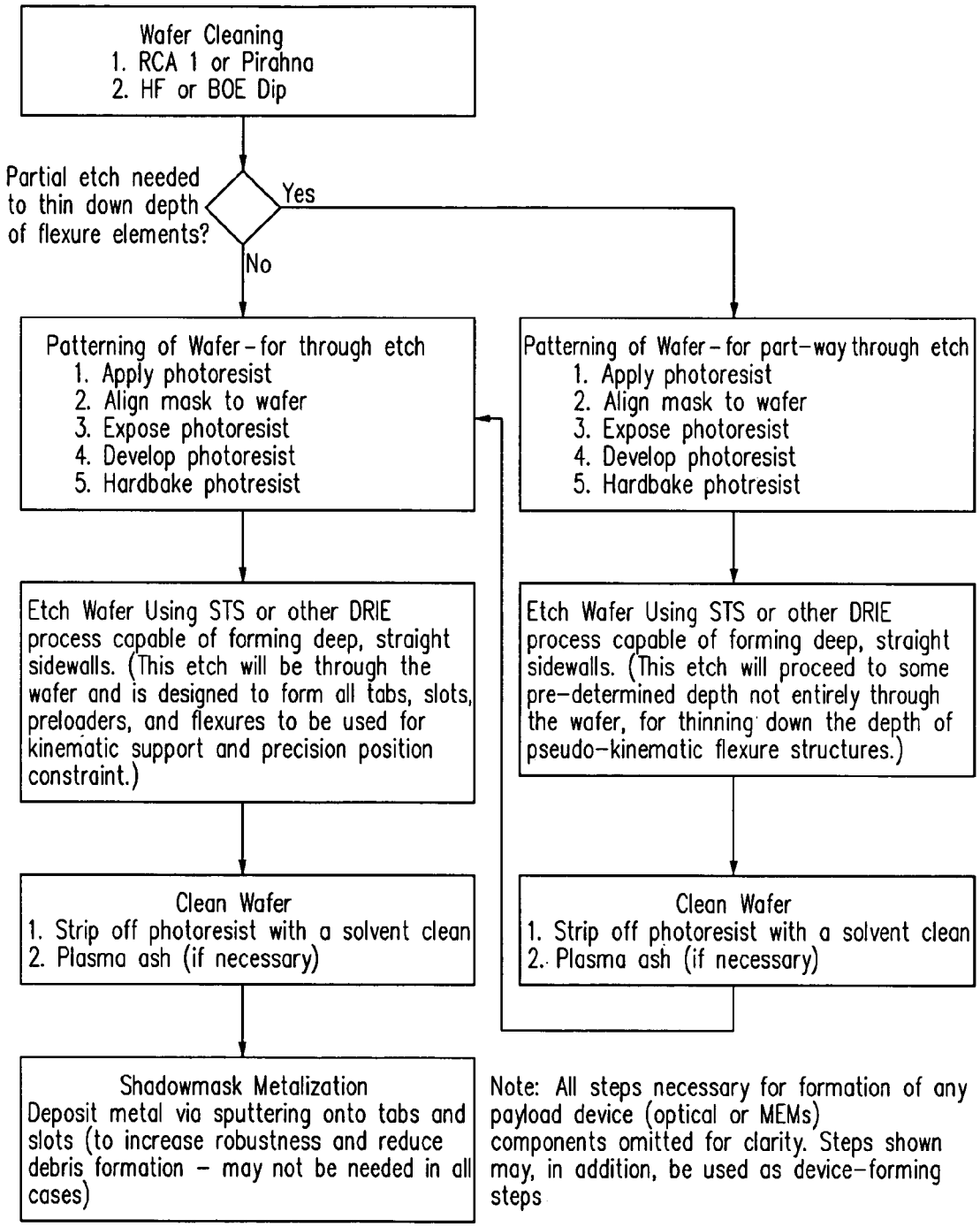
FIG. 8 is a flow chart of an exemplary method for making the high precision, three-dimensional structures of the present invention.
Figure 9:
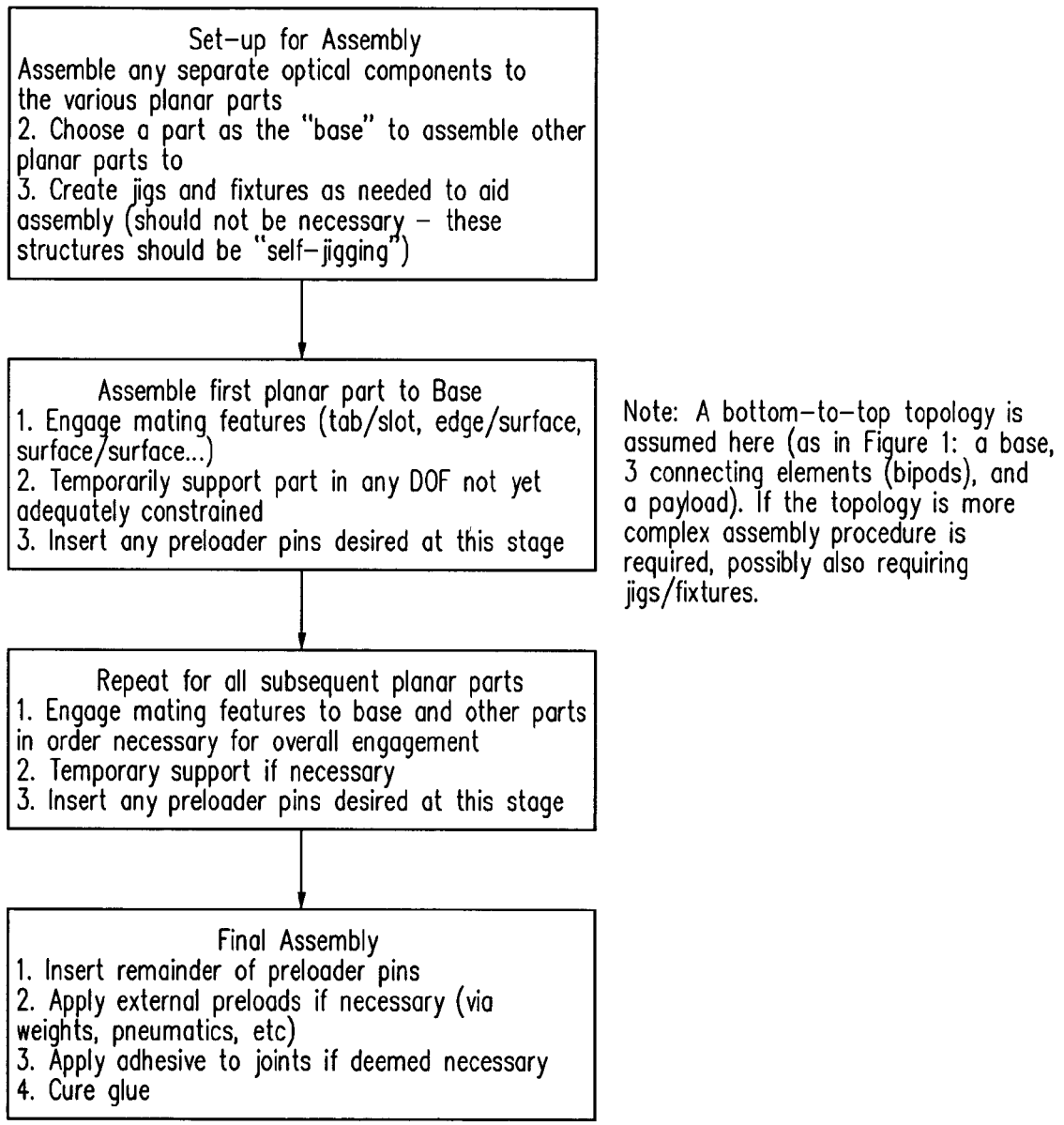
FIG. 9 is a flow chart of an exemplary method for assembling the three-dimensional structures of the present invention.

After the fabricated components are cleansed, the components are assembled to form a desired micromachined passive alignment assembly. The fabrication processes described above may be used for making any part, element, patterned wafer, or component of the micromachined passive alignment assemblies described herein. FIGS. 7-9 provide additional details on component micromachining design, fabrication and assembly in accordance with the present invention.

Alternative manufacturing methods exist in the prior art, whereby any of the structures described herein can be manufactured using a variety of such methods, including injection molding, computer numerical control (CNC) machining, metal stamping, hot embossing, and electro-discharge-machining (EDM).

Pseudo-Kinematic Connecting Element, Flexure Systems, Ball Joints, Attachment Points FIG. 3 is a partial perspective view of one embodiment of a pseudo-kinematic connecting element flexure system and an attachment point 300. "Pseudo-kinematic" means that, although there may be many DOFs connecting at least two bodies through a plurality of connecting elements, such as two micromachined passive alignment assemblies, in a practical attachment scheme, the DOFs can be tailored such that only six DOFs have a relatively high stiffness, and substantially all other DOFs have a relatively low stiffness. In some applications, it is desirable to have at least one DOF with low stiffness to be two to three orders of magnitude lower than a DOF with high stiffness. DOFs with different levels of stiffness may be accomplished using a flexure system, such as the flexure system 300 of FIG. 3, to relieve stiffness in unwanted DOFs. Hereinafter, "kinematic" may be used to refer to pseudo-kinematic attachments.

In FIG. 3, the pseudo-kinematic connecting element flexure system and attachment point 300 comprises a body 302, a flexure system 304, and an attachment portion 306. The flexure system 304 couples the body 302 to the attachment portion 306. The attachment portion 306 and the flexure system 304 may be collectively referred to herein as a "ball joint," a "ball joint flexure" or a "flexured ball joint" in a planar structure. A ball joint is a useful pseudo-kinematic structure that is relatively stiff in substantially all translations and relatively soft in substantially all rotations.

One embodiment of the attachment portion 306 of FIG. 3 comprises a mounting tab 308 with mating surfaces (contact surfaces) 310A, 310B, 310D, 310E, which may provide high precision dimensional control to mating elements. The flexure system 304 comprises two flexure elements 312, 314 that form a bipod-like structure. Each flexure element 312, 314 is very stiff in at least an axial direction. Thus, each flexure element 312, 314 provides a very stiff connection between the attachment portion 306 and the body 302 in DOFs 316 and 318, as shown in FIG. 3.

Depending on the cross-sectional properties of the flexure system, the connecting elements may have compliant (or "soft") rotations become stiff and stiff translations become soft. The cross-sectional properties of the flexure elements 312, 314 include blade depth 320, blade length 322, and blade thickness 332. If the blade depth 320 of the flexure elements 312, 314 is significantly smaller (e.g., less than 1/10) than the blade length 322, the attachment of the body 302 to the attachment portion 306 by the flexure elements 312, 314 may have two stiff DOFs 316, 318 (i.e., forming a bipod), and other relatively softer DOFs 324, 326, 328, 330.

In other applications, if the flexure elements 312 and 314 have a blade depth 320 that is significant (e.g., greater than about 1/10 of the blade length 322), then DOF 324 has significant stiffness, and the attachment has the properties of a ball joint. The rotational DOFs 326, 328 may become stiffer compared to DOF 330, which is primarily controlled by the flexure blade width 332. In one embodiment, DOFs 326, 328 are soft and DOF 330 is very soft compared to DOFs 316, 318. Depending on the exact magnitude and the sensitivity of a particular design, the soft DOFs 326, 328 may not cause any problems.

The stiffness of DOFs is highly dependent on the exact cross-sectional properties (blade depth 320, length 322, and thickness 332) of the flexure elements 312, 314. It would be relatively easy to make the "soft" rotational DOFs 326, 328 stiffer and make the "stiff" translation 324 softer by changing the cross-sectional properties. As long as the blade length 322 is much greater than the blade depth 320 and the blade thickness 332, e.g., a 10 to 1 ratio (other ratios may be used), the "very stiff" translations 316 and 318 and the "very soft" rotation 330 will remain unchanged for this configuration.

In one configuration, it is desirable to have a ball joint at both ends of the body 302 to form a monopod connecting element (not illustrated). This configuration would create an appropriate set of stiff DOFs to make the monopod connecting element act like a single DOF constraint between two bodies.

Design/Fabrication Considerations

Since the alignment features of the connecting element 300 discussed above are all coplanar lines, a mask with the desired pattern can be made for the patterning process (e.g., lithography). The patterning process can locate alignment features with high precision in a substrate wafer plane immediately adjacent to the mask.

In some applications, it may be important to consider two design and fabrication points for the connecting element 300 of FIG. 3. First, the mask sides or regions of a substrate wafer intended to form mating features should be substantially in contact with the mask sides of other elements for highest precision. For example, for highest precision, the mask sides of the feature should be the upper surface of the base assembly (e.g., 12 of FIGS. 1A, 1B) and a lower surface of the payload assembly (e.g., 14 of FIGS. 1A, 1B).

Second, a micromachining process may either etch (cut) through the substrate wafer in a perfectly perpendicular manner or with a draft (e.g., inward draft). Etching the substrate in a perfectly perpendicular manner is the ideal case. If drafting occurs, it is recommended to have an inward draft with acute angles measured from the mask plane to the etched sides of the substrate wafer. It may be important to ensure contact at the masked side of the substrate wafer. In one embodiment, the amount of draft should be as small as practical, such as just enough draft to ensure there is nothing beyond a perpendicular cut (outward draft; obtuse angle) within the error of the micromachining process. For example, in one configuration, the draft is half a degree.

As a result of inward drafts, some of the ideal line contacts may be reduced to point contacts with very shallow angles. The mating surfaces for the base assembly, the payload assembly and the connecting element 300 may all experience drafts. Thus, the respective mating surfaces of the features (which define lateral position reference line segments) may actually be contact points on the mask sides of the base assembly and the payload assembly. Inward drafting may be acceptable because the two planes of two mating surfaces, which coincide at a point contact, form a very acute angle. Thus, if a load is applied, a substantial contact path may be formed, and hence, result in reasonable contact stresses.

Pseudo-Kinematic vs. Partially-Degenerate Support

Figure 4:
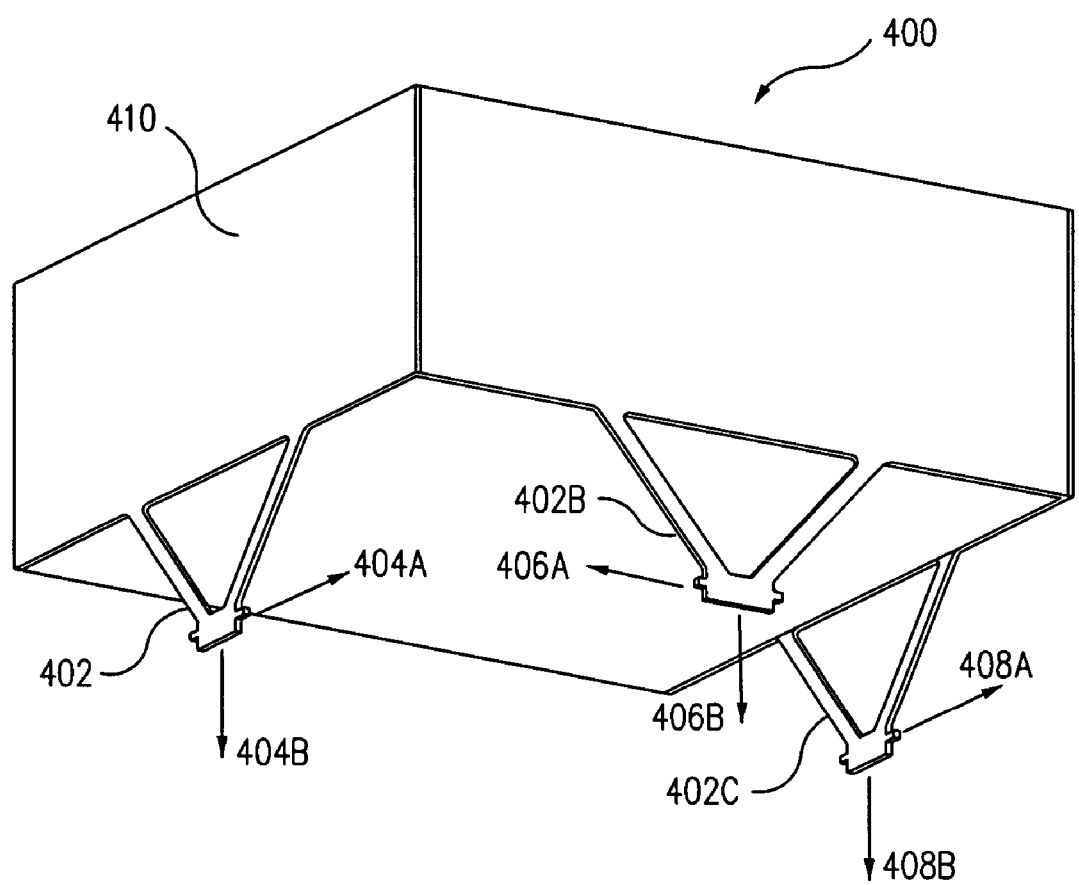
FIG. 4 is a perspective view of an exemplary embodiment of a pseudo-kinematic support system in accordance with the present invention.
Figure 5:
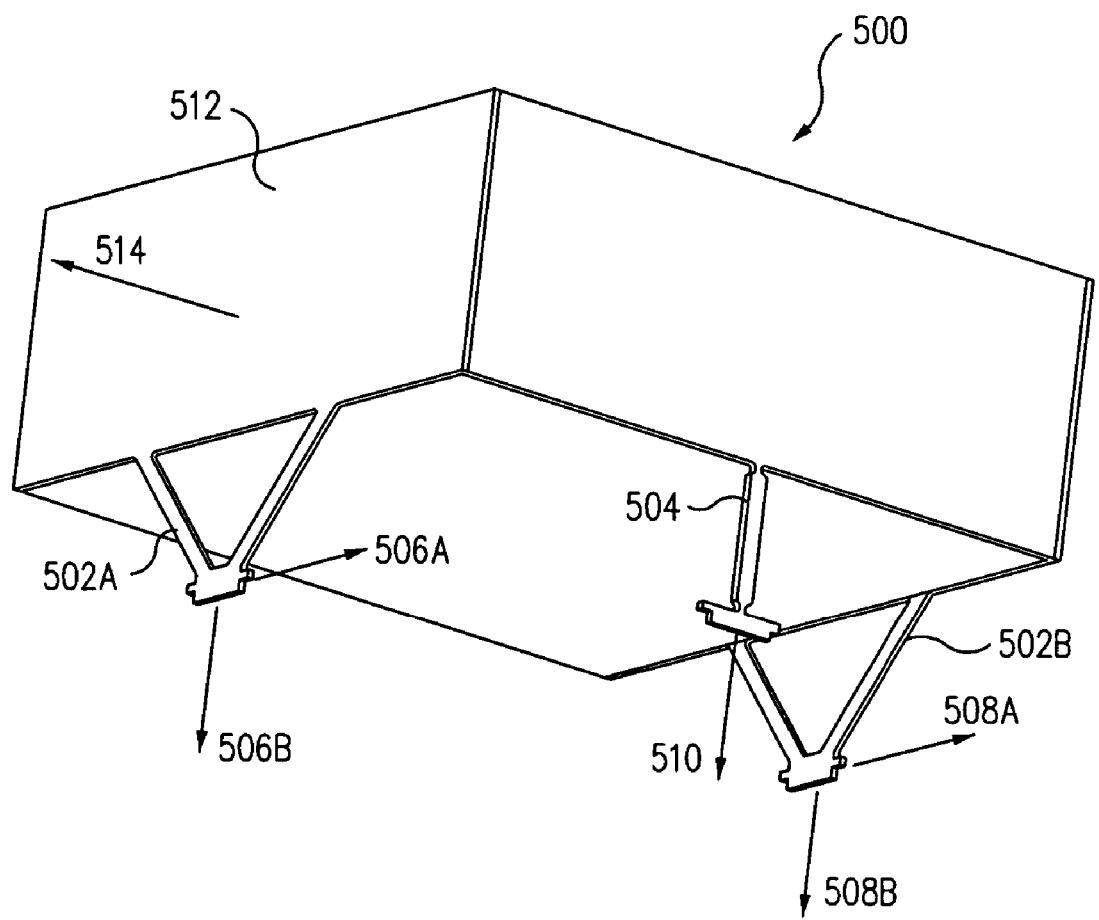
FIG. 5 is a perspective view of an exemplary embodiment of a partially-degenerate support system in accordance with the present invention.
Figure 6:
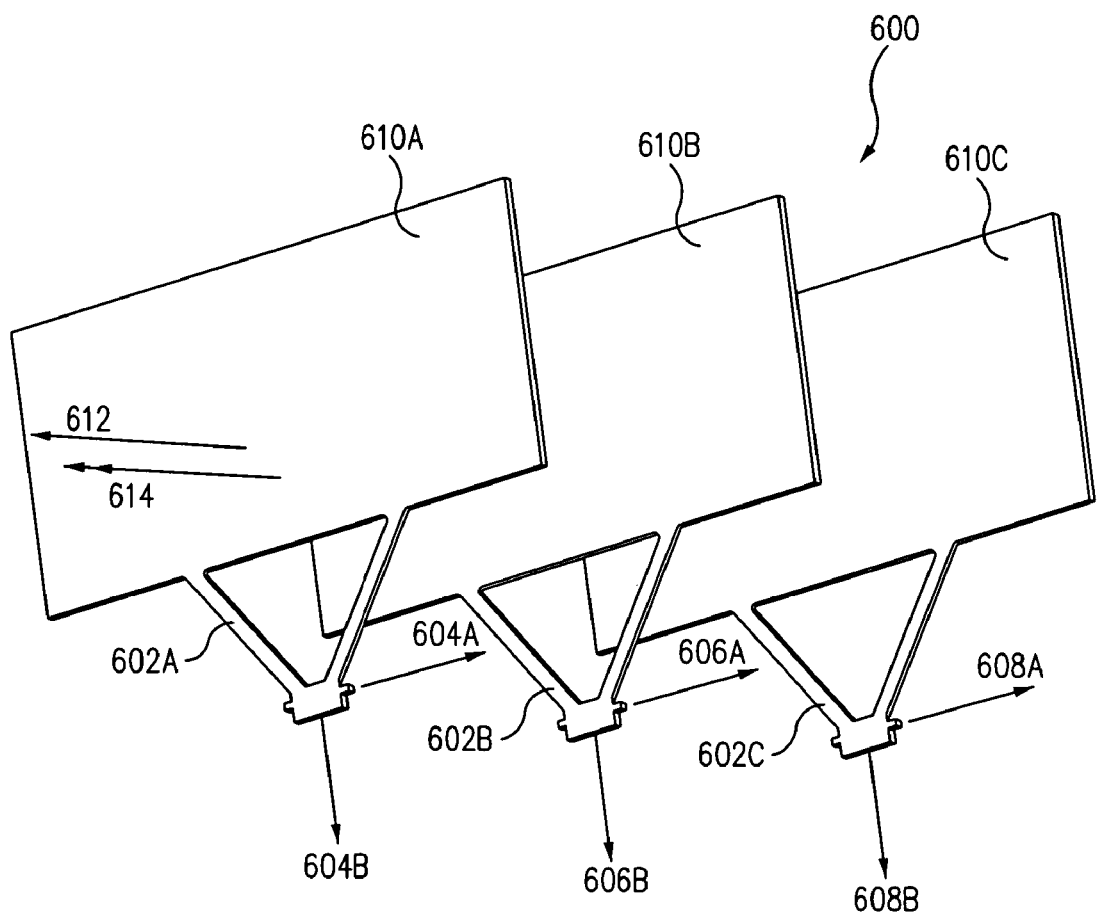
FIG. 6 is a perspective view of another exemplary embodiment of a partially-degenerate support system in accordance with the present invention.

FIGS. 4, 5 and 6 illustrate the difference between a pseudo-kinematic support system and partially-degenerate support systems. FIG. 4 is a perspective view of one embodiment of a pseudo-kinematic support system 400. The pseudo-kinematic support system 400 of FIG. 4 comprises a box-like structure 410 and three pseudo-kinematic, planar, bipod connecting elements 402A-402C (referred to as "bipod connecting elements"). Each bipod connecting element 402 may have two stiff or very stiff DOFs. For example, bipod connecting element 402A has two stiff DOFs 404A-404B. Bipod connecting element 402B has two stiff DOFs 406A-406B. Bipod connecting element 402C has two stiff DOFs 408A-408B. Thus, the bipod connecting elements 402A-402C may constitute a complete support (six stiff DOFs) for the box-like structure 410 (e.g., base assembly or payload assembly). The remaining DOFs (not shown in FIG. 4) may be soft. To determine whether or not a set of support DOFs is kinematic, redundant, or degenerate, the directions and points of application of each set of support DOFs should be considered. Kinematic may also be referred to as "determinate" or "statically determinate." Redundant may also be referred to as "indeterminate" or "statically indeterminate."

In some applications, it is desirable to have a degenerate support system, for example, when building a motion control stage. A degenerate support system constrains base and payload assemblies with less than six DOFs. As a result, there may be some trajectory (i.e. combination of Cartesian DOFs) of the payload assembly relative to the base assembly that is unconstrained. A degenerate support system may occur when a connecting element is missing or when certain connecting elements are parallel.

Although a degenerate support and a partially-degenerate support constrain base and payload assemblies with less than six DOFs, a degenerate support will move in some trajectory direction that is unconstrained while a partially-degenerate support will move in some trajectory direction that is resisted by soft DOF(s) from the pseudo-kinematic connecting elements. The trajectory direction of the degenerate support would have no restoring force and zero resonant frequency. Meanwhile, the trajectory direction of the partially-degenerate support would have relatively little restoring force, and a relatively low resonant frequency.

FIG. 5 is a three-dimensional view of one embodiment of a partially-degenerate support system 500. The partially-degenerate support system 500 in FIG. 5 comprises a box-like structure 512, two pseudo-kinematic, planar, bipod connecting elements 502A-502B (referred to as "bipod connecting elements") and one pseudo-kinematic, planar, monopod connecting element 504 (referred to as "monopod connecting element"). While the two bipod connecting elements 502A-502B each have two stiff DOFs 506A-506B, 508A-508B, the monopod connecting element 504 has one stiff DOF 510. Because the bipod connecting elements 502A-502B and the monopod connecting element 504 are pseudo-kinematic, the remaining DOFs (not shown) may be soft.

Since the partially-degenerate support system 500 restrains the structure 512 with five stiff DOFs 506A-506B, 508A-508B, and 510, there may be some trajectory direction 514 for the structure 512. Motion in this trajectory (motion direction) 514 is resisted by out-of-plane bending of the bipod connecting elements 502A-502B and in-plane or out-of-plane bending of the monopod connecting element 504, which are all fairly soft DOFs. Motion along trajectory direction 514 would therefore have little restoring force, and thus would have a low resonant frequency. The compliance in trajectory direction 514 would also mean any precise positioning features designed to control motion along the trajectory direction 514 may have degraded performance.

FIG. 6 is a perspective view of another embodiment of a partially-degenerate support system 600. The partially-degenerate support system 600 comprises three connecting plates 610A-610C and three pseudo-kinematic, planar, bipod connecting elements 602A-602C (referred to as "bipod connecting elements 602A-602C"). Each bipod connecting element 602A-602C has two stiff or very stiff DOFs. For example, bipod connecting element 602A has two stiff DOFs 604A-604B. Bipod connecting element 602B has two stiff DOF 606A-606B. Bipod connecting element 602C has two stiff DOF 608A-608B.

In one embodiment, where the three plates 610A-610C are rigidly attached to each other, the system 600 has a total of six stiff DOFs 604A-604B, 606A-606B, 608A-608B. The remaining DOFs (not shown) may be soft.

Because the attachment points of the three bipod connecting elements 602A-602C are collinear, one bipod connecting element 602A may be ineffective. Thus, the three connecting plates 610A-610C with three bipod connecting elements 602A-602C may have only four stiff DOFs, including two trajectory directions 612 and 614 with very low stiffness.

Motion Control Stage

As described above, a degenerate support system may be used to construct a motion control stage. The aforementioned embodiments of FIGS. 5 and 6 are two examples thereof. In some applications, it is desirable to have a more compact motion control stage that eliminates the need to assemble structures in three dimensions. In these cases, the bipod connecting element may be replaced by a high aspect ratio "flexure." This enables the creation of motion control stages that are substantially two dimensional, or flat. A high aspect ratio flexure ("blade flexure") has three stiff DOFs and three soft DOFs. These blade flexures have been used in the prior art to form motion control stages, as shown in FIGS. 10A, 10B and 11A, 11B, but the invention described herein provides for significant improvements in the control of the motion and the range of travel of the stages by taking advantage of the pseudo-kinematic principles taught herein. Thus, in FIG. 10A, a prior art motion control stage 100 has the payload 106 attached to the base 104 using two blade flexures 102. As shown in FIG. 10B, the relatively unconstrained DOF provides for a circular, or arcuate, trajectory that is not precisely linear. In other words, the trajectory is along a combination of two DOFs, rather than along a single DOF. As shown in FIGS. 11A-11B, a prior art double parallel flexure 110 addresses the problem of arcuate motion of the stage 116, but it geometrically couples the stiff DOF to the unconstrained DOF, resulting in a nonlinearity in the stiffness of the unconstrained DOF.

As a result, the travel of the stage along the trajectory is limited because either the stiffness is too high (compared with other DOFS), or the stress in the flexures is so high that it causes them to fracture.

One aspect of the present invention relates to an assembly configured to position at least one optical element along a pre-determined trajectory to form a motion control stage. This is achieved by using a "degenerate" support or connecting element that constrains the payload assembly in less than six DOFs. As a result, there is a trajectory of the payload assembly relative to the base assembly that is unconstrained or resisted by soft DOF(s) from the pseudo-kinematic connecting elements. The optical element may be positioned at different parts of the trajectory by providing an external force that moves the optical element to a particular point in the trajectory.

For example, in the case of an assembly configured to constrain an optical element in all but one translational DOF, the optical element is able to move along a nearly linear trajectory. The stiffness for the constrained DOFs will ideally be much higher than for the unconstrained DOF. In this case, only a small amount of force is required to move the optical element in the unconstrained linear trajectory. At any point along the trajectory, the position of the payload is determined with high precision due to the kinematic or pseudo-kinematic design.

Another aspect of the invention requires redundant DOFs which are used to further control the trajectory of the optical element. In other words, a partially-degenerate support member is provided in which at least one constrained DOF is redundant with another, and the redundant pairs of constrained DOFs provide substantially counterbalancing forces on the payload during motion along the unconstrained trajectory. As a result of the counterbalancing force, the trajectory can be desirably modified. For example, the redundant DOF can be used to increase the straightness of the motion for a linear motion control stage. An example of this application is shown in FIG. 6.

Another aspect of the invention relates to modifying the support structure to reduce the stiffness of constrained redundant DOFs during motion along a trajectory so as to reduce the effect of geometric coupling of the redundant DOF and the unconstrained DOF during motion of the payload along the trajectory. This reduces the nonlinearity in the stiffness along the unconstrained DOF, reduces the stress in the supporting elements during motion along the trajectory, and increases the range of motion of the motion control stage along the trajectory.

Figure 12:
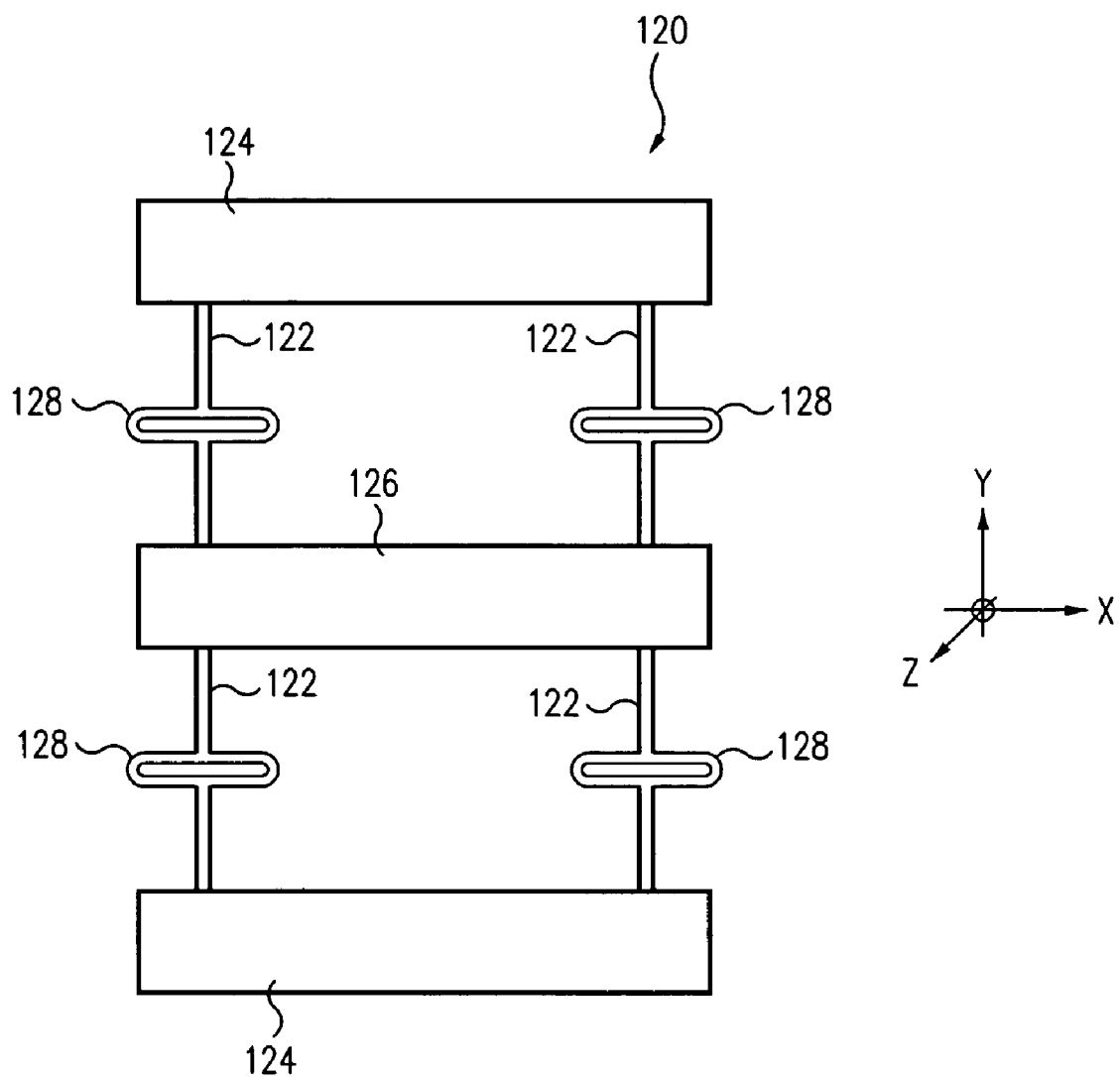
FIG. 12 is a top plan view of a motion control stage incorporating an exemplary embodiment of a flexure with strain relief in accordance with the present invention.
Figure 13A:
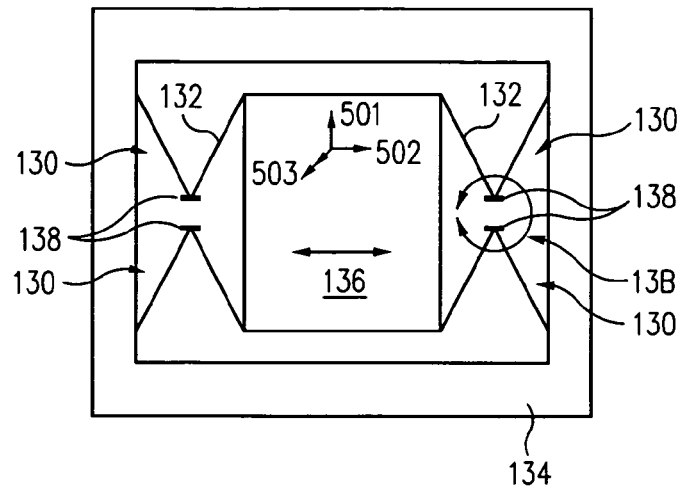
FIG. 13A is a top plan view of a motion control stage incorporating an exemplary embodiment of a secondary connecting element in accordance with the present invention, in which a secondary connecting element of the flexure is shown encircled.
Figure 13B:
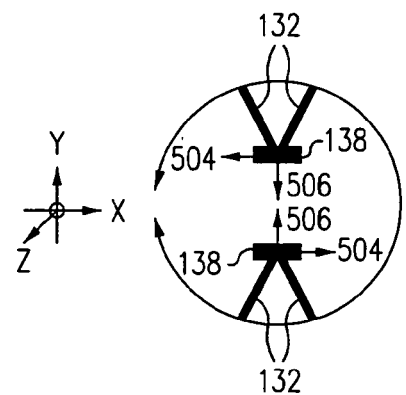
FIG. 13B is an enlarged detail view of the encircled secondary connecting element of the flexure of FIG. 13A.

An exemplary embodiment of this aspect of the invention is shown in the plan view of a motion stage assembly 120 of FIG. 12. In this case, additional strain relief features 128 are added to the simple blade flexures 122 to reduce their longitudinal stiffness. This not only reduces the stiffness of the redundant DOFs, but also reduces the effect of geometric coupling of DOFs. As a result, the nonlinearity in the stiffness of the unconstrained DOF is largely eliminated, thereby increasing the range of motion in the unconstrained trajectory while reducing the stiffness in the unconstrained DOF. In the particular embodiment illustrated in FIG. 12, the strain relief features 128 are oval-shaped, i.e., like the letter "O". Alternative embodiments, such as those illustrated in FIGS. 13-23, may have strain relief features 128 shaped like the letter "M", "S", "W", or any other shape that is either radially symmetrical about an axis through the centroid of the strain relief feature and perpendicular to its plane (i.e., the Z axis illustrated in the several views), or bilaterally symmetrical about an axis through its centroid and parallel to its plane (i.e., the X axis illustrated). FIG. 13A shows a second exemplary embodiment of the novel blade flexures of the invention. In this case, a payload 136 is supported by four folded-blade flexures 132. By using folded-blade flexures 132, their stiffness along the redundant DOF is substantially reduced, compared with the prior art double parallel flexures shown in FIG. 11A. In this particular embodiment, the strain relief features are also flexures that are connected to the other flexure at an acute angle that is substantially less than 180 degrees. As a result, the same advantages are obtained as described above in connection with the embodiment of FIG. 12.

Another aspect of the invention relates to adding a secondary connecting element between intermediate points on at least two connecting elements of the support structure to substantially increase the stiffness of undesired payload trajectories while leaving the desired payload trajectory substantially unconstrained. During payload motion along an undesired trajectory, intermediate points on two connecting elements move with respect to each other in a first DOF. During payload motion along a desired trajectory, said intermediate points on said two connecting elements move with respect to each other in a second DOF. A secondary connecting element is then used to couple said two intermediate points on said two connecting structures, such that the stiffness in said first DOF is substantially higher than in said second DOF. The result is that the payload is substantially constrained in the undesired trajectory and substantially unconstrained in the desired trajectory.

For example, the motion control stage 136 depicted in FIG. 13A has relatively low stiffnesses in two translational DOFs 501, 502, and one rotational DOF 503, as indicated by the arrows in the figure. If a linear motion stage is desired, then one translational DOF 501 and the rotational DOF 503 must be made considerably stiffer (at least 10×) than that of the desired trajectory DOF 502. During motion of the payload 136 along undesired trajectories 501, 503, intermediate points 138 on the connecting elements 132 (in this case, folded-blade flexures) move in shear with respect to each other, as shown by motion trajectory 504 in FIG. 13B. During motion of the payload 136 along the desired trajectory 502, the intermediate points 138 on the connecting elements 132 move together, undergoing a change only in their spacing, as shown by motion trajectory 506 in FIG. 13B.

Figure 17:
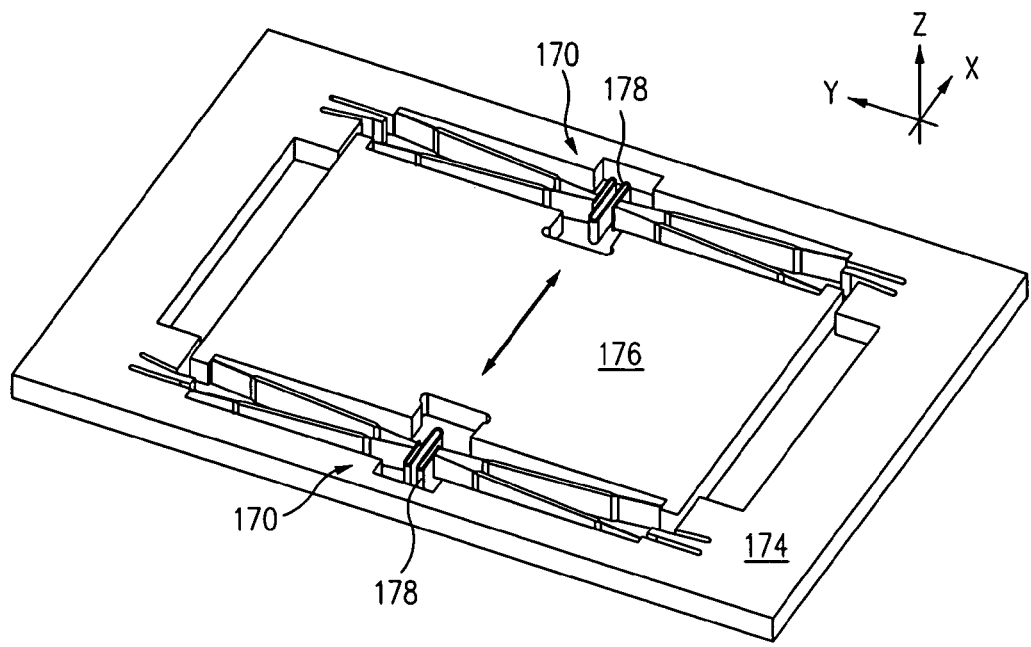
FIG. 17 is a perspective view of the motion control stage of FIG. 14A, in which the stage is shown supported within the opening of a support frame for coplanar, rectilinear movement therein by a pair of connecting elements in accordance with the present invention.

FIGS. 14-17 show various embodiments of the linear motion stage with variously shaped secondary connecting elements 148, 158, 168, respectively, used to increase the stiffness in motion trajectory 504 while minimizing the stiffness in motion trajectory 506. FIGS. 14A, 14B illustrate an embodiment in which the secondary connecting element 148 has the shape of the letter "M". FIGS. 15A, 15B illustrate an embodiment in which the secondary connecting element 158 has the shape of the letter "S". FIGS. 16A, 16B illustrate an embodiment in which the secondary connecting element 168 has the shape of the letter "O". One of ordinary skill in the art will readily appreciate that there exist other possibilities for the shape of the secondary connecting element that would satisfy the requirements outlined by the teachings of the present invention. FIG. 17 is a perspective view of the motion control stage of FIG. 14A. In this view, it is clear that the secondary connecting element 178 in this exemplary embodiment also has a high aspect ratio.

Figure 18:
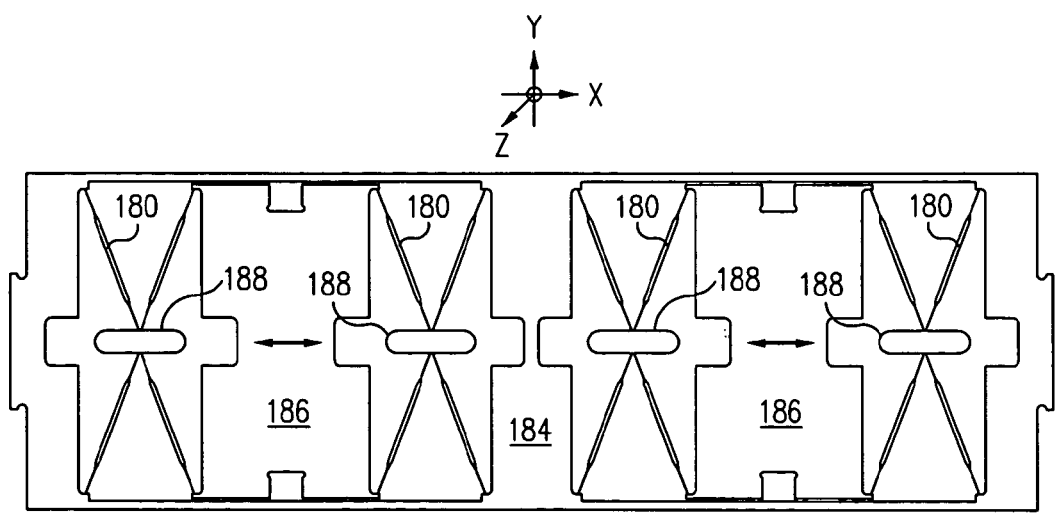
FIG. 18 is a top plan view of a pair of movable stages, in which each stage is shown supported within a respective opening of a support frame for coplanar, rectilinear movement therein by a respective pair of connecting elements in accordance with the present invention.
Figure 19A:
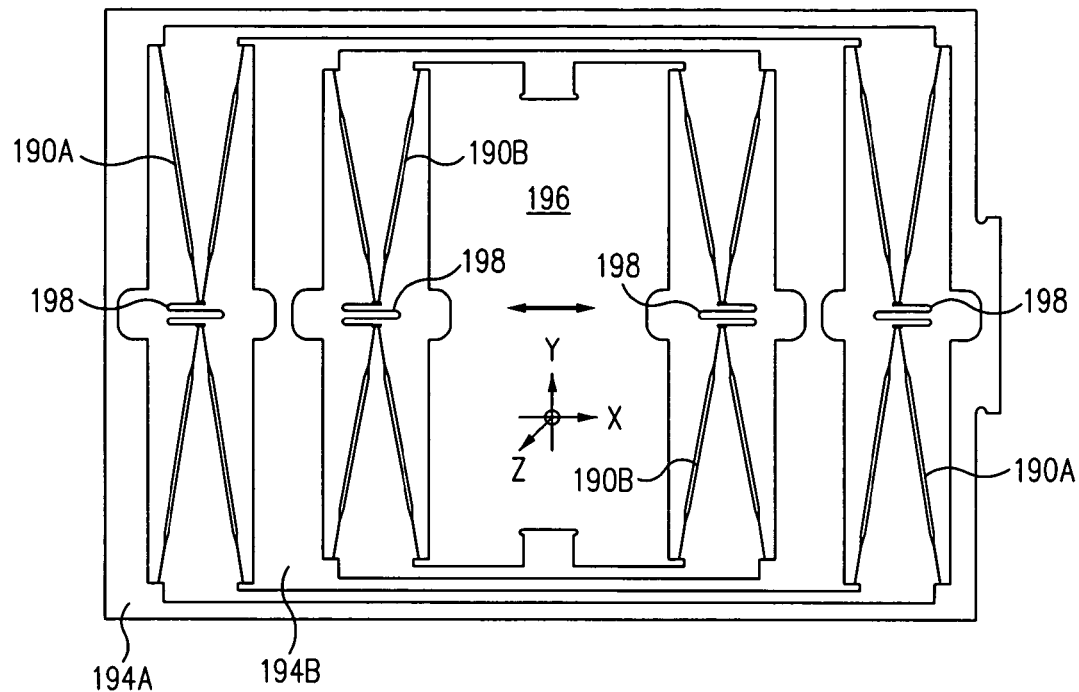
FIG. 19A is a top plan view of a pair of cascaded stages, each supported within a respective opening of a respective support frame for respective coplanar, rectilinear movement therein by a respective pair of connecting elements in accordance with the present invention.
Figure 19B:
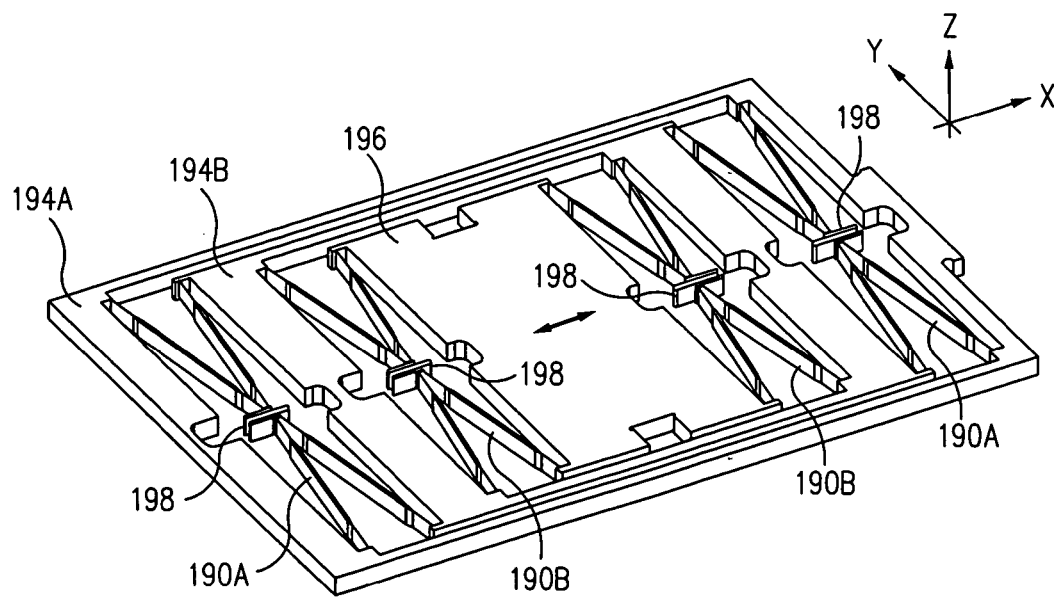
FIG. 19B is a perspective view of the cascaded stages of FIG. 19A.

According to one aspect of the current invention, multiple motion control stages can be assembled together to achieve a variety of advantageous embodiments. In FIG. 18, two motion control stages are manufactured on the same substrate. In this embodiment, the alignment of the two respective payloads 186 can be ensured to be highly precise. In FIG. 19A, a first motion control stage 196 is shown embedded inside a second motion control stage 194B. FIG. 19B is a perspective view of the same cascaded motion control stage. By cascading two sets of flexures 190A and 190B, i.e., by disposing one motion control stage inside of another, as illustrated in FIGS. 19A and 19B, a variety of advantages can be obtained relative to a single-stage embodiment, such as that illustrated in, e.g., FIGS. 14A, 17. First, the range of motion of the inner stage 196 is effectively doubled for the same applied force (i.e., if the stiffness of each of the flexures 190A, 190B are substantially the same), while the maximum stress induced in the flexures remains the same as for the single-stage embodiment of FIGS. 14A, 17. Second, if the cascaded stage 196 is used at the original range of motion of the single stage embodiment, that same motion can be obtained using only half the applied force, with only about half the level of stress of the single stage flexures. Accordingly, cascading may be used either to increase the range of movement of the stage, or to reduce both the stress in the flexures and the force necessary to achieve a given displacement of the stage 196. It is thus more efficient to cascade a stage than to simply double the length of the flexure arms in a single stage design. Less area is used by the stage assembly, and stiffness in some of the other DOFs will actually be greater than in a single stage that uses larger flexures.

Figure 20A:
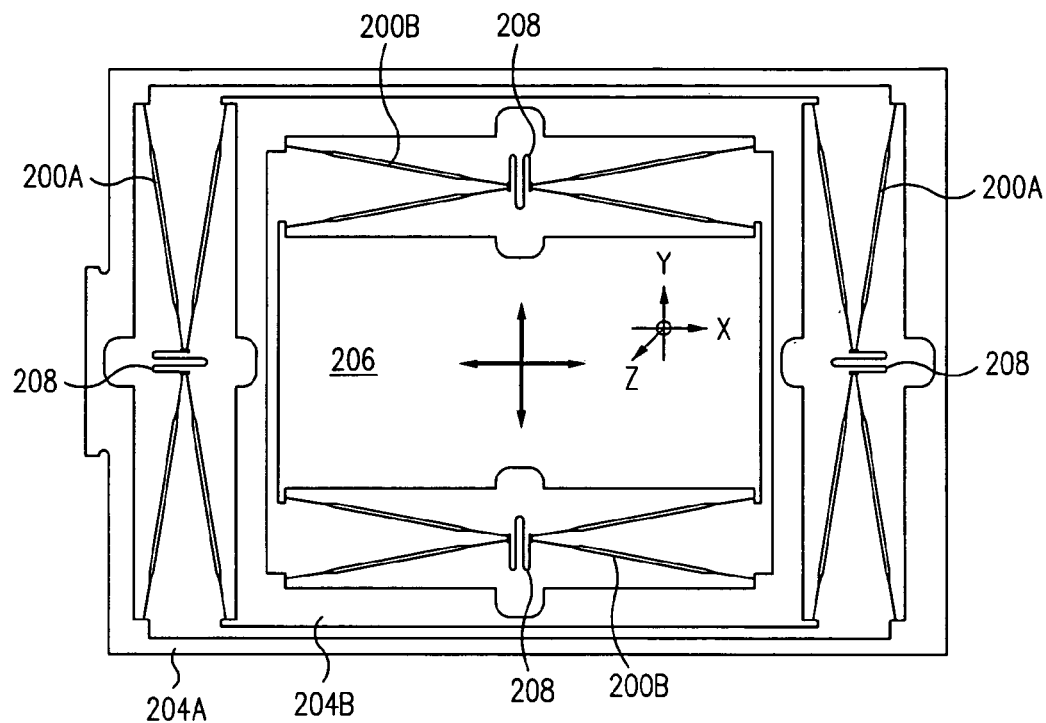
FIG. 20A is a top plan view of a pair of cascaded stages respectively supported for respective movement along each of two orthogonal axes by respective pairs of connecting elements in accordance with the present invention.
Figure 20B:
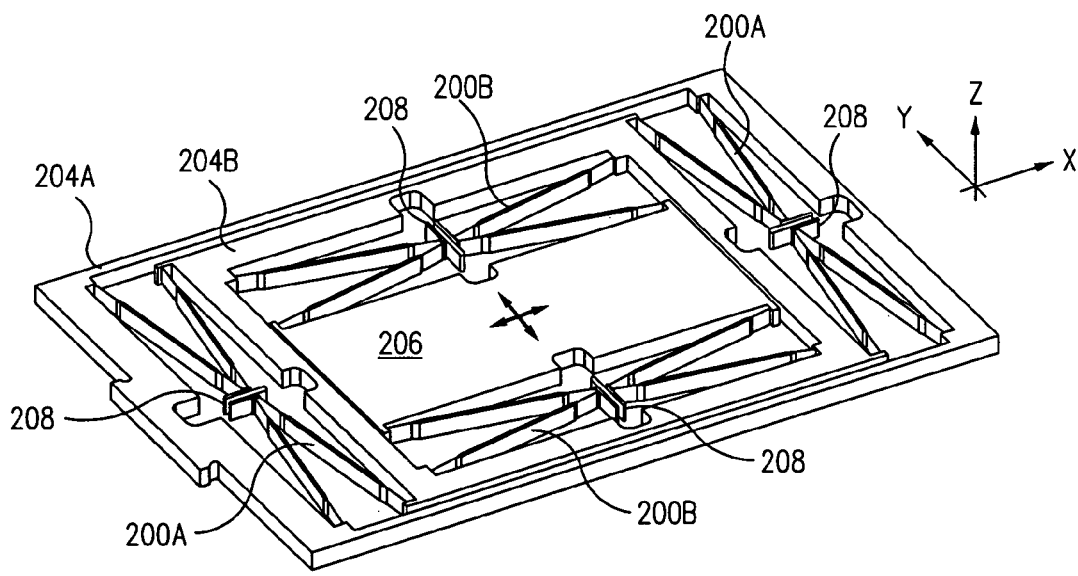
FIG. 20B is a perspective view of the cascaded stages of FIG. 20A.

FIGS. 20A and 20B are respectively top plan and perspective views of another motion control stage assembly incorporating a pair of cascaded stages 204B and 206, each supported within a respective opening of a respective support frame for respective coplanar, rectilinear movement by respective pairs of cruciform supporting elements or flexures 200A and 200B, each having an M-shaped secondary connecting element 208, in a configuration similar to that of FIGS. 19A and 19B. However, it should be noted that, in the cascaded embodiment of FIGS. 20A and 20B, the inner and outer stages are arranged to move perpendicularly relative to one another in the X-Y plane. Thus, if actuated by suitable motive forces, the inner stage 206 of such an embodiment can achieve substantially any type of rectilinear movement in the X-Y plane, rather than along just a single axis thereof.

Figure 14A:
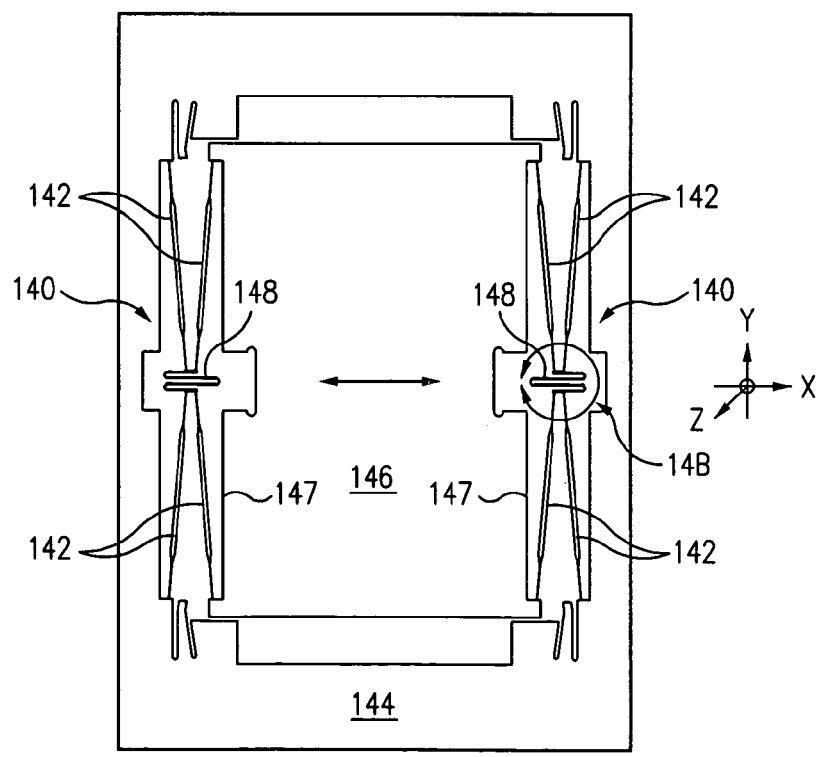
FIG. 14A is a top plan view of a stage assembly incorporating another exemplary embodiment of a connecting element in accordance with the present invention, in which the secondary connecting element of the flexure is shown encircled.
Figure 14B:
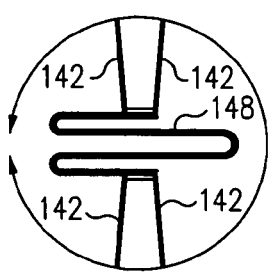
FIG. 14B is an enlarged detail view of the encircled secondary connecting element of the flexure of FIG. 14A.
Figure 21:
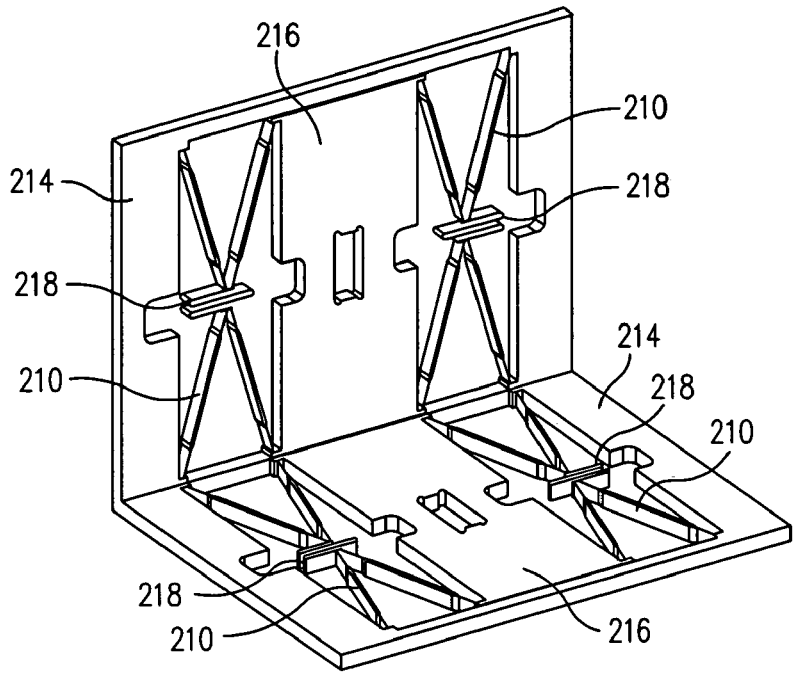
FIG. 21 is a perspective view of a non-planar motion control stage containing a pair of movable stages disposed at a right angle to each other and supported within a respective opening of a respective support frame for respective coplanar, rectilinear movement therein by respective pairs of connecting structures in accordance with the present invention.
Figure 22:
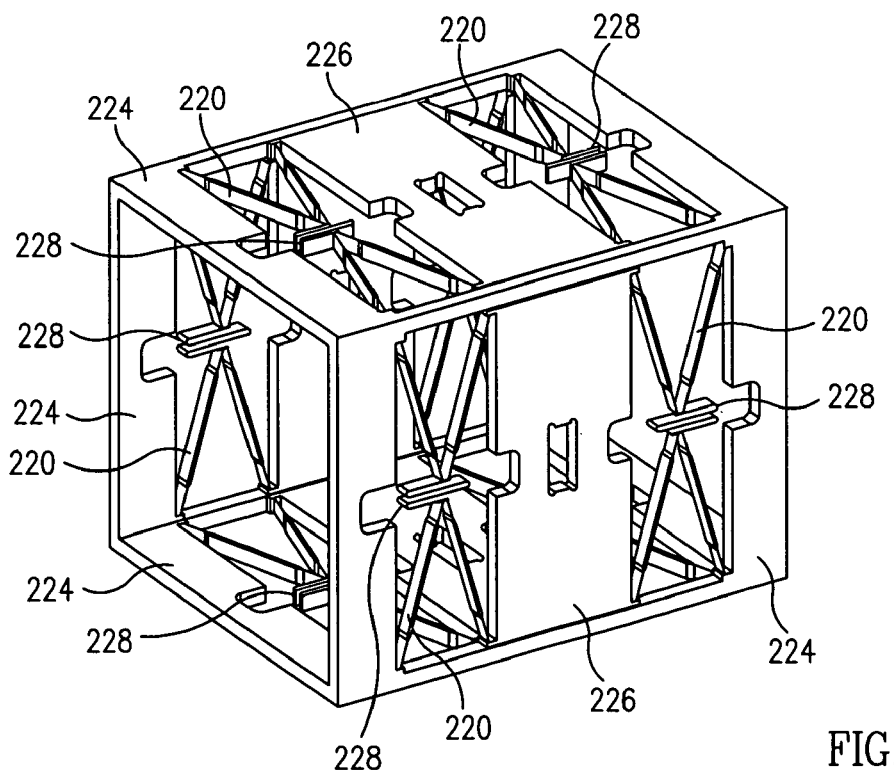
FIG. 22 is a perspective view of a non-planar motion control stage containing four movable stages disposed adjacent to each other at right angles and supported within a respective opening of a respective support frame for respective coplanar, rectilinear movement therein by respective pairs of connecting elements in accordance with the present invention.

Alternative exemplary embodiments of "non-planar" motion control stage assembly embodiments are illustrated in FIGS. 21 and 22, respectively. In FIG. 21, a pair of single-stage assemblies, similar to that illustrated in FIG. 14A, are connected to each other along a common side such that the respective stages 216 of the two assemblies are disposed at substantially a right angle to each other, and in FIG. 22, four such single-stage assemblies are connected to each other such that adjacent ones of their respective stages 226 are disposed at right angles to each other to form a box-like structure. Such non-planar configurations are useful for commonly supporting large and/or eccentric payloads (not illustrated) on the respective stages thereof, such as "large format" (i.e., same size or larger than a whole planar stage) lens assemblies of cameras. Thus, two stages mounted at right angles to each other, but having the same direction of rectilinear motion, such as illustrated in the embodiment of FIG. 21, have substantially increased rotational stiffness, thereby providing better straight-line motion in the presence of eccentric loads acting on the stages. The four-stage embodiment of FIG. 22, in which the stages are connected to the payload as two parallel pairs of stages disposed at right angles to each other, have even greater stiffness in the non-motion linear and rotational directions.

Another aspect of the invention relates to adding an actuator to the motion control stage to electronically control the position of the motion control stage along its predetermined trajectory. In this case, the actuator provides a force along one or more DOFs to move the payload along the substantially unconstrained trajectory. For example a magnetic voice-coil actuator may be integrated with the motion control stage to provide a force that moves the optical element along a desired trajectory. This actuator is composed of a coil and a permanent magnet, where the magnet is mounted on the payload and the coil is mounted on the base or vice versa. By running variable amounts of electrical current through the coil, the force between the coil and the magnet can be selectably adjusted to move the motion control stage to different points along its trajectory. Other types of actuators may be used, and an example using an electrostatic actuator is described in more detail below.

Figure 23A:
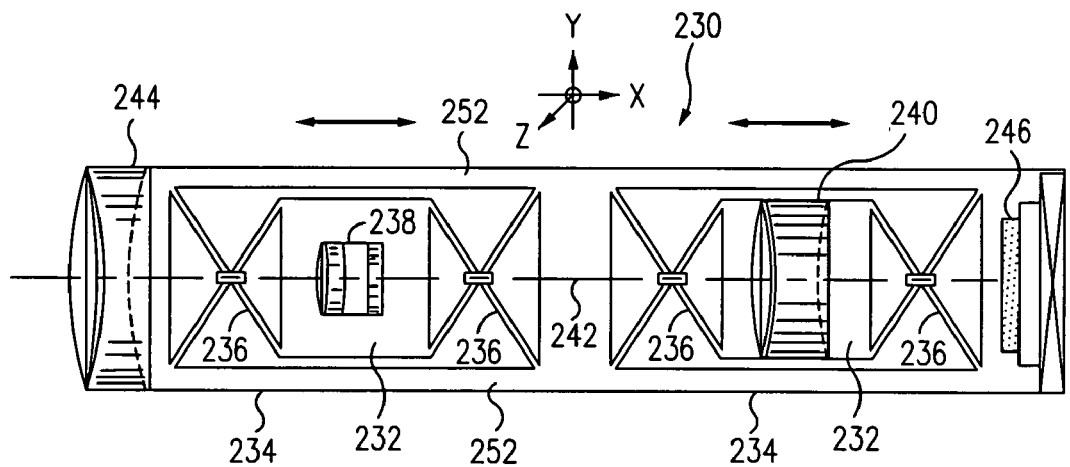
FIG. 23A is top plan view of a MEMS camera incorporating a pair of rectilinearly movable stages, each having a lens assembly mounted thereon and a pair of connecting element assemblies coupled to opposite sides thereof in accordance with an exemplary embodiment of the present invention.
Figure 23B:
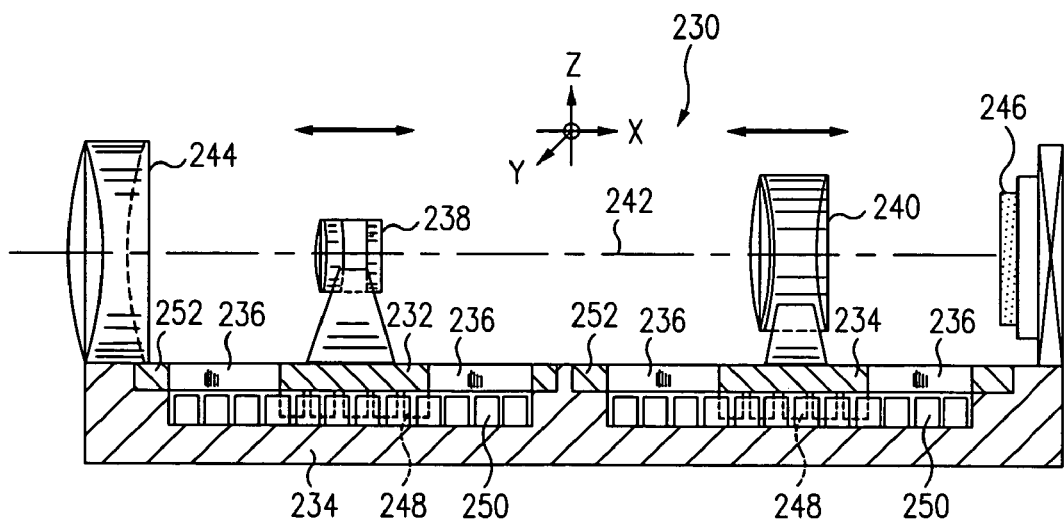
FIG. 23B is a partial cross-sectional elevation view of the MEMS camera shown in FIG. 23A.

An exemplary MEMS camera device 230 incorporating a pair of, e.g., electrostatically motion control stages 232 therein, each supported relative to a fixed baseplate, or stator portion 234 by a pair of "cruciform" connecting element assemblies 236 in accordance with an exemplary embodiment of the present invention, is illustrated in the top plan and partial cross-sectional elevation views of FIGS. 23A and 23B, respectively. The camera is of a type that might be incorporated into, e.g., a cellular telephone having image capturing and transmitting capabilities. Each of the motion control stages carries a respective lens-element payload 238 and 240, e.g., a zoom lens element, and an autofocusing lens element, for respective independent, substantially rectilinear movement thereof along the optical axis 242 of the camera (i.e., the X axis in the particular embodiment illustrated), relative to the stator 234, and thus, relative to a third lens assembly 244, e.g., an objective lens, and a integrated circuit camera microchip 246, that are both respectively fixed to the stator.

In the particular embodiment illustrated, the two stages 232 are independently urged with straight-line motion along the optical axis 242 of the camera by, e.g., electrostatic forces that result from varying voltages applied to selected ones of upstanding, interdigitated "comb" fingers 248 and 250 formed on the respective opposing surfaces of the stator and the stage, as illustrated in FIG. 23B. However, it should be understood that other mechanisms for motivating the stages relative to the stator, such as pneumatic, hydraulic, electromagnetic, piezoelectric, magnetostrictive and the like, are also known in the art, and may be substituted for the electrostatically actuated comb structures illustrated.

As will be appreciated by those of skill in the optical art, it is very desirable from the standpoint of the image quality of the camera 230 that the respective movements of the zoom and autofocus lens elements 238 and 240 of the camera be precisely confined to movement along a trajectory corresponding to the optical axis 242 of the camera. Otherwise, the images produced by the camera will be distorted and/or unfocused. Further, it is desirable that the range of such rectilinear movement of the two stages be large enough to provide the camera with the largest possible ranges of focus and zoom, consistent with the overall size, e.g., 6×6×14 mm, of such a micro-miniature camera.

To achieve these ends, each of the stages 232 of the camera are suspended relative to the stator 234 by means of a pair of cruciform connecting element assemblies 236 in accordance with the present invention, as illustrated in FIGS. 23A and 23B. The connecting elements couple respective ones of two opposite sides of each stage to an opposing, inner edge of a coplanar support frame 252 that surrounds the stages, and that mounts on and in parallel opposition to the stator structure 234. The connecting elements 236 serve to space the stage apart from the stator, to avoid any frictional contact therebetween (although in some embodiments, there may be some frictional contact between the stage and stator) and to provide substantially coplanar, rectilinear motion of the stages relative to the support frame, and hence, relative to the stator, in a direction substantially perpendicular to the two supported sides of the stage. The novel connecting elements 236 of the invention thus provide straight-line motion of the stage to within one micron over several millimeters of travel, with wobble at the arcsecond level, a high ratio of in-plane and out-of-plane lateral stiffness to in-plane travel direction stiffness, and a substantially longer range of travel, viz., up to about 60% of the length of the flexures in said connecting elements, than prior art flexures.

Another aspect of the invention relates to a method of making a micromachined flexure assembly in a structure that is a part of a motion control stage. The method comprises using lithography to form a pattern on a substrate for the structure. The pattern outlines a set of connecting elements, a support frame, and a center stage coupled to the support frame by the set of connecting elements. The method further comprises etching the substrate to form the structure according to the pattern. The micromachining process is described in detail above.

Miniature Camera with Variable Focus/Zoom

According to one aspect of the present invention, a variable focus lens assembly is provided for a miniature camera. The variable focus lens can be either manually operated (manual focus) or automatically operated, (autofocus). According to one aspect of the present invention, a zoom lens assembly is provided for a miniature camera. According to one aspect of the present invention, image stabilization is provided for a miniature camera. The variable focus, zoom, and image stabilization can all be implemented using micro electromechanical system (MEMS) technology to move a stage upon which an optical component is disposed.

As used herein, the term "miniature camera" is defined to include those cameras that are suitable for use in contemporary cellular telephones (camera phones), personal data assistants (PDAs), and the like.

Figure 26:
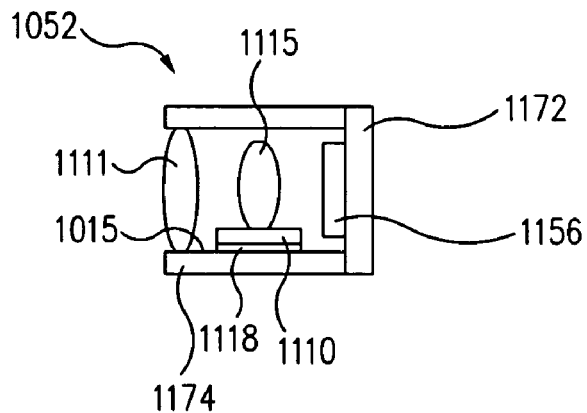
FIG. 26 is a semi-schematic cross-sectional side view of a variable focus camera according to one exemplary embodiment of the present invention, wherein a stationary lens has positive refractive power and a movable lens has positive refractive power.
Figure 27:
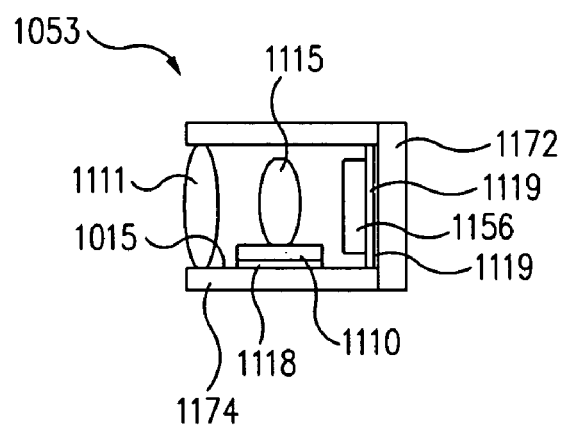
FIG. 27 is a semi-schematic cross-sectional side view of a variable focus camera having image stabilization according to one exemplary embodiment of the present invention, wherein a stationary lens has positive refractive power and a movable lens has positive refractive power.
Figure 28:
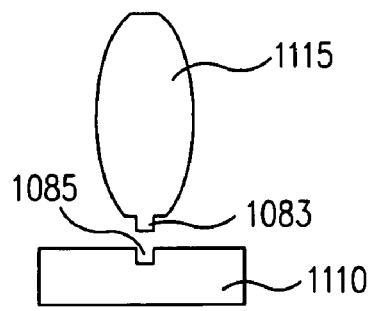
FIG. 28 is a semi-schematic cross-sectional side view showing attachment of a an optical element such as a lens or lens assembly to a movable stage, according to one aspect of the present invention.
Figure 29:
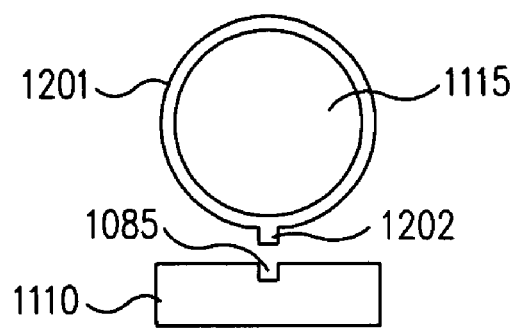
FIG. 29 is semi-schematic end view shown attachment of an optical element such as a lens or lens assembly to a moveable stage via a lens ring, according to one aspect of the present invention.

Exemplary embodiments of the miniature camera of the present invention are illustrated in FIGS. 24-29. FIGS. 28 and 29 illustrate fabrication methods that can be used according to the present invention.

Figure 24:
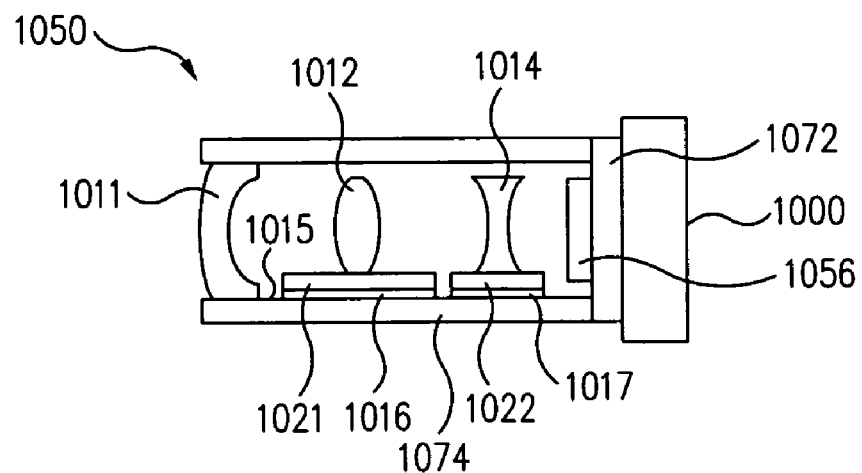
FIG. 24 is a semi-schematic cross-sectional side view of a variable focus camera having an optical zoom according to one exemplary embodiment of the present invention, wherein a stationary lens has negative refractive power, a first movable lens has positive refractive power, and a second movable lens has negative refractive power.

Referring now to FIG. 24, a miniature camera variable focus and optical zoom assembly 1050 constructed according to one embodiment of the present invention comprises a stationary lens 1011 having a negative refractive power. A movable lens 1012 having positive refractive power is disposed behind the stationary lens 1011 and a moveable lens 1014 having negative refractive power is disposed behind the movable lens 1012.

Movable lens 1012 is formed to a miniature stage 1021 that uses a MEMS actuator 1016 to effect linear movement thereof. Thus, movable lens 1012 can move toward and away from stationary lens 1011. Similarly, movable lens 1014 is formed to a miniature stage 1022 that uses a MEMS actuator 1017 to effect linear movement thereof. Thus, movable lens 1014 can also move toward and away from stationary lens 1011. The miniature stages 1021 and 1022 can have a low profile, so as to tend to minimize the size of the variable focus and optical zoom assembly 1050.

An image sensor 1056 is disposed behind movable lens 1014. Image sensor 1056 can be formed to end cap 1072. An enclosure 1074 provides for optical alignment and protection of all optical elements and other components, such as the stages 1021 and 1022. A guide, such as a groove or track, can be formed in the inner surface 1015 of the enclosure 1074 to facilitate proper alignment and linear movement of the stages 1021 and 1022. Springs can be used to apply preloads to the stages 1021 and 1022, so as to facilitate better control of the movement thereof. The end cap 1072 is formed to the enclosure 1074 and can optionally be removably attached thereto. Electronics 1100 can be disposed proximate the end cap 1072 or elsewhere, as desired.

During operation of the miniature camera, light enters the variable focus and optical zoom assembly 1050 through the stationary lens 1011, passes through movable lens 1012 and movable lens 1014, and produces an image upon image sensor 1056. Stage 1021 and stage 1022 cooperate with MEMS actuator 16 and MEMS actuator 1017 to move lens 1012 and lens 1014, respectively. Movement of lens 1012 and lens 1014 effects focus and zoom for the miniature camera according to well known principles.

The size of the optical zoom assembly defined by stationary lens 1011, movable lens 1012, movable lens 1014, stage 1021, stage 1022, MEMS actuator 1016, and MEMS actuator 1017 is determined, to a large extent, by the size of the image sensor 1056. For example, for a 1.3 Megapixel image sensor having a diameter of 3 millimeters, the optical zoom assembly can be large enough to require an enclosure having an outside diameter of approximately 4 millimeters.

Figure 25:
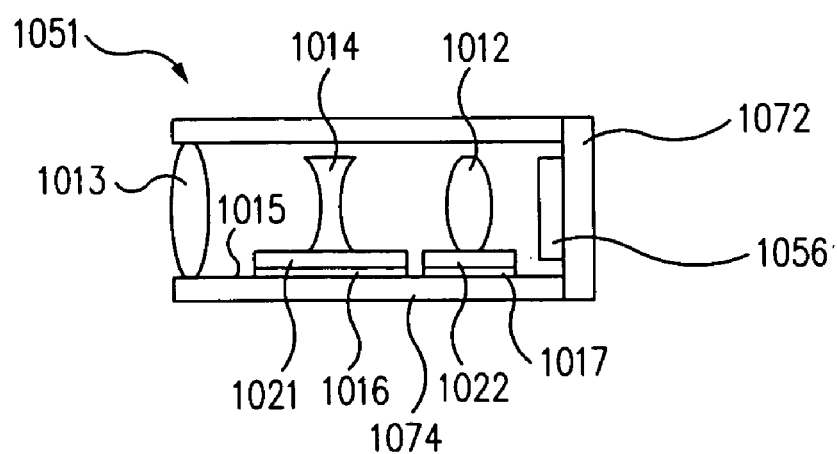
FIG. 25 is a semi-schematic cross-sectional side view of a variable focus camera having an optical zoom according to one exemplary embodiment of the present invention, wherein a stationary lens has positive refractive power, a first movable lens has negative refractive power, and a second movable lens has positive refractive power.

Referring now to FIG. 25, a miniature camera variable focus and optical zoom assembly 1051 constructed according to one embodiment of the present invention is similar to the variable focus and optical zoom assembly 1050 of FIG. 24, except that it comprises a stationary lens 1013 having a positive refractive power and the positions of movable lens 1012 and movable lens 1014 are reversed. Thus, light enters the miniature camera 1051 through stationary lens 1013, passes through movable lens 1014 and movable lens 1012, and produces an image upon image sensor 1056. Stage 1021 and stage 1022 cooperate with MEMS actuator 1016 and MEMS actuator 1017 to move lens 1014 and lens 1012, respectively. Again, movement of lens 1014 and lens 1012 effects focus and zoom for the miniature camera according to well know principles.

Referring now to FIG. 26, a miniature camera variable focus assembly 1052 constructed according to one embodiment of the present invention comprises a stationary lens 1111 having a positive refractive power. A movable lens 1115 having positive refractive power is disposed behind the stationary lens 1111. Alternatively, stationary lens 1111 can have negative refractive power and movable lens 1115 can have positive refractive power. As a further alternative, stationary lens 1111 can have positive refractive power and movable lens 1115 can have negative refractive power.

Movable lens 1115 is formed to a miniature stage 1110 that uses a MEMS actuator 1118 to effect linear movement thereof. Thus, moveable lens 1115 can move toward and away from stationary lens 1111.

As in the embodiments of FIGS. 24 and 25, an image sensor 1156 is disposed behind movable lens 1115 and can be formed to an end cap 1172. An enclosure 1174 provides for optical alignment and protection of all optical elements. The cap 1172 is formed to the enclosure 1174 and can optionally be removably attached thereto.

Referring now to FIG. 27, a miniature camera variable focus assembly 1053 constructed according to one embodiment of the present invention is similar to the variable focus assembly 1052 of FIG. 26, except that image stabilization is additionally provided. Image stabilization is provided by facilitating movement of the sensor 1156 and/or lens 1115 in a manner that tends to compensate for movement of the miniature camera during an exposure. Such movement of sensor 1156 and/or lens 1115 can be two dimensional. That is, MEMS actuators and stages can be provided to facilitate movement of sensor 1156 and/or lens 1115 along both directions of a plane that is perpendicular to the optical axis of the variable focus assembly.

Two separate stages, each having a dedicated MEMS actuator, can be used to move an optical element in two orthogonal directions. The stages may be stacked, one atop the other, for example. Thus, a first stage can move the optical element in a first direction and a second stage that is formed upon the first stage can move the optical element in a second direction that is orthogonal to the first direction.

Image stabilization can be achieved by only moving either lens 1115 or image sensor 1156. Alternatively, both lens 1115 and image sensor 1156 can be moved, such as simultaneously with respect to one another, so as to effect image stabilization. Moving both lens 1115 and sensor 1156 together can provide a greater range of motion, so as to compensate for a greater range of motion of the camera.

Alternatively, image stabilization can be effected by moving one optical element in one direction and by moving another optical element in another (e.g., orthogonal) direction. For example, one lens can be moved in a first direction in a plane that is perpendicular to the optical axis of the camera and another lens can be move in a second direction that is orthogonal to the first direction. As a further example, a lens can be moved in a first direction in a plane that is perpendicular to the optical axis of the camera and the image sensor can be moved in a second direction that is orthogonal to the first direction.

The movement of sensor 1156 and/or lens 1115 can be controlled based upon an output from an inertial sensor that measures movement of the miniature camera. In this manner, movement of the miniature camera that would otherwise blur the image can be compensated for by movement of sensor 1156 and/or lens 1115. Image stabilization thus allows longer exposure times to be used without the need for a tripod. It also better facilitates imaging in low light conditions where longer exposures are desired.

The MEMS actuators used to move the optical elements of the present invention may be of various different types. The stages and/or MEMS actuators may be formed using micromachining and/or wafer level assembly. Indeed, non-MEMS actuators may likewise be used to move the optical elements.

Referring now to FIG. 28, according to one aspect of the present invention, movable optical element such as a lens 1015 can be passively (in a manner that does not vary substantially during use—as opposed to being actively aligned, wherein an actuator is used to dynamically move the lens during operation) aligned with respect to miniature stage 1110. For example, the lens 1115 can have a mating feature such as post 1083 formed thereon and the stage 1110 can have a complimentary mating feature such as hole 1085 formed therein. The mating features can be of any desired cross-section.

For example, a square cross-section tends to inhibit undesirable rotation of the lens. Thus, the lens 1115 can be passively aligned with respect to the stage 1110 by placing the post 1083 into the hole 1085. The mating features provide a close fit of the lens 1115 with respect to the stage 1110, such that substantially only a single position or alignment of the lens 1115 with respect to the stage 1110 is possible. In this manner, the correct alignment is maintained. Adhesive can be used to secure the post 1083 within the hole 1085. Thus, lens 1115 can be supported at a single point upon the periphery thereof.

The mating feature may be built into the lens 1115 when the lens 1115 is formed, such a during an injection process.

Alternatively, the mating feature may be formed upon the lens 1115 after the lens 1115 has been formed. The mating feature may be formed upon the lens 1115 by micromachining, for example.

Similarly, the mating feature may be formed in the stage 1110, when the stage 1110 is being formed. For example, the mating feature may be micromachined into the stage at the wafer level.

Lens 1115 can have a lens ring that is disposed about the periphery thereof. Lens 1115 can thus cooperate with the lens right to define an optical element. Post 1083 can be formed upon the lens ring rather than upon lens 1115 itself.

Referring now to FIG. 29, the optical element can comprise a lens having a lens ring 1201 formed generally about the periphery thereof. A mating feature, such as a post 1202 can mate with a complimentary feature such as hole 1085 in stage 1110, as discussed above.

Figure 30:
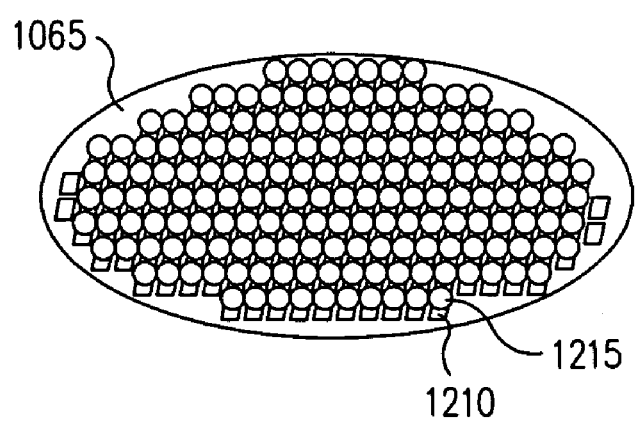
FIG. 30 is a semi-schematic perspective top view of a wafer level assembly wherein lenses are attached to stages according to one aspect of the present invention.

Referring now to FIG. 30, an assembly of miniature stages 1210 having optical elements, such a movable lenses 1215, disposed thereon is shown. The miniature stages 1210 are formed via micromachining of a wafer 1065 according to one aspect of the present invention. The wafer 1065 can be comprised of silicon, glass, metal, ceramic, or any other material that is suitable for the fabrication of the stages 1210. Before the stages 1110 are singulated (such as by dicing or etching), lenses 1115 are mounted thereon. Mounting of optical elements, such as the lenses 1110, at the wafer level simplifies the use of a pick and place machine for such mounting, since the locations of the stages upon the wafer are precisely known because they can be defined via photolithography. Alternatively, the wafer can be diced before the optical elements are formed to the stages.

Wafer level fabrication can similarly be used to form the stages upon the imaging sensor. For example, the enclosures may be formed atop the imaging sensors and the stages then formed within or inserted into the enclosures.

According to one aspect of the present invention, a miniature stage having optics formed thereon can be mounted inside of a package or enclosure that contains additional optical elements, such as lenses and/or an image sensor.

The electronics 1100 required to drive the stage(s) and/or otherwise operate the miniature camera can be integrated into the camera, such as behind the end cap 1072 (FIG. 24). The electronics required to drive the stage(s) can be integrated into the stages by performing MEMS processing on top of a CMOS wafer.

Various miniature camera features, such as variable focus, zoom, and image stabilization, are described herein. It is understood that these features may be used alone or in any desired combination.

Although the figures depict the stationary lens as the outermost lens (the lens that light first encounters when entering the optical assembly), such construction is by way of example only, and not by way of limitation. Those skilled in the art will appreciate that the outermost lens may alternatively be a movable lens and that the stationary lens may not be the outermost lens. Thus, the stationary lens may be between a movable lens and the image sensor, for example. Indeed, the number, position, and order of the lenses may be varied, as desired, without departing from the spirit of the invention.

The lenses shown in the drawings and discussed herein may be either single element lenses or lens assemblies (compound lenses). As those skilled in the art will appreciate, compound lenses tend to mitigate undesirable aberrations in the imaging system of the miniature camera. The lenses may comprise either plastic or glass lenses.

The types of lenses shown in the figures are by way of example only, and not by way of limitation. Those skilled in the art will appreciate that different types of lenses (such as those having different configurations and/or different refractive powers) can be substituted for the lenses shown or can be added to the optical assemblies shown. Various different optical elements, such as additional lenses, mirrors, prisms, and/or windows, may be interposed or added to the optical assemblies of the miniature camera without departing from the teachings of the present invention. For example, a mirror or prism may be used to turn incoming light so that the miniature camera may receive light from a different direction with respect thereto, thus facilitating a different orientation for camera mounting.

The image sensor used according to the present invention can be a charge coupled device (CCD) or a complimentary metal oxide semiconductor (CMOS) type of device. More that one image sensor can be used. For example, separate image sensors may be used for red, green, and blue (or cyan, magenta, and yellow). When it is desired to dispose such a plurality of image sensors on a stage, such as for image stabilization, then all of the sensors can be placed on a common stage, or alternatively, each sensor can be placed on a separate stage. The image sensor(s) can include a filter, as is common according to contemporary practice.

According to one or more embodiments of the present invention, any optical element may be moved with any desired degrees of freedom so as to achieve any desired result. For example, the image sensor may be moved along the optical axis of the camera to facilitate focusing. Further, the lenses and/or the image sensor may be rotated about any desired axis to facilitate alignment or special effects. Indeed, any or all of the optical elements may be moved in all six degrees of freedom, if desired.

The miniature camera described herein is suitable for use in various small devices, including cellular telephones, laptop computers, personal data assistants (PDAs), webcams, and surveillance systems. The MEMS based optical assemblies of the present invention are smaller, easier to assemble, and less costly than their contemporary counterparts.

According to at least one aspect of the present invention, the lenses of the miniature camera generally need to be located in three dimensions, i.e., distributed in a volume of space, and have three rotations specified and/or controlled. In some cases, the location may need to be specified and/or controlled at points along a specific trajectory.

As defined and used herein, "kinematic mounting" relates to attaching two bodies, which may be called a base assembly and a payload assembly, together by forming a structural path and creating stiffness between the two bodies in six, and only six, independent degrees of freedom ("DOFs") or directions. Each degree of freedom (DOF) kinematically controlled between two bodies is also a position defined, i.e., a specific value of that DOF, as a linear measurement, may be maintained. Six DOFs are desired because the location of any object in space is defined by three orthogonal coordinates, and the attitude of the object is defined by three orthogonal rotations.

A kinematic support has the advantage of being stiff, yet any strains or distortions in the base assembly are not communicated to the payload assembly. Thus, any sensitive optical alignments are not altered in the payload assembly if the base assembly undergoes deformation due to applied loads or bulk temperature changes.

In one embodiment, it is desirable to tailor a DOF based on the configuration of a "pseudo-kinematic" support. "Pseudo-kinematic" means that although there may be many DOFs connecting at least two bodies, such as two micromachined passive alignment assemblies, in a practical attachment scheme, the DOFs can be tailored such that only six DOFs have a relatively high stiffness, and substantially all other DOFs have a relatively low stiffness.

Thus, true "kinematic" support means only 6 stiff DOFs connecting two parts, and no other stiffness paths exist. "Pseudo-kinematic" means there are 6 DOFs with relatively high stiffness, and possibly many more with much lower stiffness (typically two to three orders of magnitude less). In some applications, it is desirable to have pseudo-kinematic DOFs with relatively low stiffness to be two to three orders of magnitude lower than DOFs with relatively high stiffness.

DOFs with different levels of stiffness may be accomplished using a flexure system to relieve stiffness in unwanted DOFs. Depending on the cross-sectional properties of elements in the flexure system, connecting elements between two bodies may attain the desired stiffness connectivities.

A connecting element may be configured to restrain the base assembly and the payload assembly with one or more desired DOFs. In some embodiments, a "degenerate" support or connecting element may be used where less than six constrained DOFs between a base and payload are desired. The degenerate support may allow some trajectory (i.e., a combination of Cartesian DOFs) of a payload assembly relative to a base assembly to be unconstrained. A "redundant" support or connecting element may be used to further control the trajectory of a payload assembly relative to a base assembly.

One aspect of the invention relates to an assembly configured to position at least one optical element along a predetermined trajectory to form a motion control stage. This is achieved by using a "degenerate" support or connecting element that constrains the payload assembly in less than six DOFs. As a result, there is a trajectory of the payload assembly relative to the base assembly that is unconstrained or resisted by soft DOF(s) from the pseudo-kinematic connecting elements. The optical element may be positioned at different parts of the trajectory by providing an external force that moves the optical element to a particular point in the trajectory.

For example, in the case of an assembly configured to constrain an optical element in all but one translational DOF, the optical element is able to move along a nearly linear trajectory. The stiffness for the constrained DOFs will ideally be much higher than for the unconstrained DOF. In this case, a small amount of force is required to move the optical element in the unconstrained linear trajectory. At any point along the trajectory, the position of the payload is determined with high precision due to the kinematic or pseudo-kinematic design.

Another aspect of the invention relates to using redundant DOFs to further control the trajectory of the optical element. In this case, a partially-degenerate support is provided where at least one constrained DOF is redundant with another and the pair of redundant constrained DOF provide substantially counterbalancing forces on the payload during motion along the unconstrained trajectory.

Another aspect of the invention relates to modifying the support structure to reduce the stiffness of constrained redundant DOFs during motion along a trajectory so as to reduce the effect of geometric coupling of the redundant DOF and the unconstrained DOF during motion of the payload along the trajectory. This can be used to reduce the stiffness along the unconstrained DOF, to reduce the stress in the supporting elements during motion along the trajectory, or to increase the range of motion of the motion control stage along the trajectory.

Another aspect of the invention relates to adding a secondary connecting element between intermediate points on at least two connecting elements of the support structure to substantially increase the stiffness of undesired payload trajectories while leaving substantially unconstrained the desired payload trajectory.

Thus, according to one or more embodiments of the present invention, miniature cameras, such as those of camera phones, having variable focus, optical zoom, and/or image stabilization are provided. Such features are facilitated, at least in part, by the use of a stage that is positioned only on one side of a lens or lens assembly and thus is much less bulky that a lens barrel.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. A miniature camera, comprising:
    a motion control assembly comprising a substantially planar surface supported by a substantially coplanar flexure comprising a passive, resilient, substantially planar joint configured so as to permit a single degree of translational movement of the surface in a plane coplanar with the surface and to inhibit movement of the surface in at least one other degree of freedom; and,
    an optical element having an optical axis, the optical element being formed to the motion control assembly such that the optical axis of the optical element is substantially parallel to the planar surface of the motion control assembly.

2. The miniature camera as recited in claim 1, wherein the motion control assembly is formed from at least one of silicon, plastic, and metal.

3. The miniature camera as recited in claim 1, wherein the motion control assembly is formed by at least one of micromachining, injection molding, stamping, laser ablation, etching and wafer level manufacturing.

4. The miniature camera as recited in claim 1, wherein the motion control assembly comprises:
    a substantially planar stage having a pair of opposite sides;
    a substantially planar support frame surrounding and coplanar with the stage; and,
    a pair of supporting element assemblies, each resiliently coupling a respective one of the opposite sides of the stage to an opposing, inner edge of the support frame for substantially coplanar, rectilinear motion of the stage relative to the trains and in a direction substantially perpendicular to the two opposite sides of the stage, wherein each of the supporting element assemblies comprises;
    a flexure configured so as to inhibit movement in at least one degree of freedom, the flexure being defined by a substantially planar cruciform structure having a pair of bipod connecting elements, each having a pair of elongated monopod connecting elements respectively joined at an acute angle defining an intermediate point; and
    a secondary connecting element coupling the respective intermediate points of the bipod connecting elements together.

5. The miniature camera as recited in claim 4, wherein the secondary connecting element is shaped substantially like an M, a W, an S or an O.

6. The miniature camera as recited in claim 1, wherein the motion control assembly is configured to facilitate at least one of focus, zoom and image stabilization.

7. The miniature camera as recited in claim 1, wherein the stage is moved by at least one of a magnetic actuator and an electrostatic actuator.

8. The miniature camera as recited in claim 1, wherein the motion control assembly is located substantially on one side of the optical element.

9. The miniature camera as recited in claim 1, wherein the motion control assembly is configured to provide movement of the first stage in one translational degree of freedom.

10. The miniature camera as recited in claim 1, wherein the stage is moved by a MEMS actuator.

11. The miniature camera as recited in claim 1, further comprising:
  another motion control assembly;
  another optical element formed to the other motion control assembly; and,
  wherein the motion control assemblies and the optical elements are moveable so as to both focus the camera and to zoom the camera.

12. The miniature camera as recited in claim 1, further comprising an image sensor and wherein the image sensor is movable so as to facilitate image stabilization.

13. The miniature camera as recited in claim 1, wherein the first optical element comprises at least one lens and wherein the stage comprises bidirectional stage assemblies that facilitate image stabilization.

14. The miniature camera as recited in claim 1, wherein the first optical element comprises a lens that is integrated with the stage at a wafer level.

15. The miniature camera as recited in claim 1, wherein the optical element comprises at least one lens that is passively aligned to the stage via mating features of the lens and the stage.

16. The miniature camera as recited in claim 1, wherein the optical element comprises a mating feature and the stage comprises a complimentary mating feature.

17. The miniature camera as recited in claim 1, wherein the optical element comprises a mating feature that is generally square in cross section and the stage comprises a complimentary mating feature.

18. The miniature camera as recited in claim 1, further comprising at least one MEMS actuator configured to move the optical element and spring configured to provide a preload to the MEMS actuator.

19. The miniature camera as recited in claim 1, further comprising at least one stationary lens, disposed along an optical axis of the first optical element.

20. A miniature camera comprising:
  a stationary lens;
  a movable lens disposed generally along an optical axis of the stationary lens; and,
  a motion control assembly having a rigid, generally planar stage to which the movable lens is formed, wherein the motion control assembly comprises at least one generally planar flexure that is coplanar with the stage and configured to provide translational movement of the stage in one degree of freedom in the plane of the stage while inhibiting movement of the stage in five other degrees of freedom, so as to facilitate at least one of focusing and zooming the camera.

21. The miniature camera as recited in claim 20, wherein the stage is movable to focus the camera.

22. The miniature camera as recited in claim 20, wherein the stage is moveable to zoom the camera.

23. The miniature camera as recited in claim 20, wherein the stage the stage is moveable to stabilize an image of the camera.

24. A miniature camera comprising:
  a motion control assembly having a substantially planar surface, the motion control assembly comprising:
    a substantially planar stage having a pair of opposite sides;
    a substantially planar support frame surrounding and coplanar with the stage;
    a pair of supporting element assemblies, each resiliently coupling a respective one of the opposite sides of the stage to an opposing, inner edge of the support frame for substantially coplanar, rectilinear motion of the stage relative to the frame and in a direction, substantially perpendicular to the two opposite sides of the stage,
    wherein each of the supporting element assemblies comprises:
      a substantially planar cruciform structure having a pair of bipod connecting elements, each having a pair of elongated monopod connecting elements respectively joined at an acute angle defining an intermediate point;
      a secondary connecting element coupling the respective intermediate points of the bipod connecting elements together; and,
      an optical element having an optical axis, the optical element being formed to the motion control assembly such that the optical axis of the optical element is substantially parallel to the planar surface of the motion control assembly.

25. The miniature camera as recited in claim 24, wherein the motion control assembly is formed from at least one of silicon, plastic, and metal.

26. The miniature camera as recited in claim 24, wherein the motion control assembly is formed by at least one of micromachining, injection molding, stamping, laser ablation, etching and wafer level manufacturing.

27. The miniature camera as recited in claim 24, wherein the secondary connecting element is shaped substantially like an M, a W, an S or an O.

28. The miniature camera as recited in claim 24, wherein the motion control assembly is configured to facilitate at least one of focus, zoom and image stabilization.

29. The miniature camera as recited in claim 24, wherein the stage is moved by at least one of a magnetic actuator and an electrostatic actuator.

30. The miniature camera as recited in claim 24, wherein the motion control assembly is located substantially on one side of the optical element.

31. The miniature camera as recited in claim 24, wherein the motion control assembly is configured to provide movement of the first stage in one translational degree of freedom.

32. The miniature camera as recited in claim 24, wherein the stage is moved by a MEMS actuator.

33. The miniature camera as recited in claim 24, further comprising:
  another motion control assembly;
  another optical element formed to the other motion control assembly; and
  wherein the motion control assemblies and the optical elements are moveable so as to both focus the camera and to zoom the camera.

34. The miniature camera as recited in claim 24, further comprising an image sensor and wherein the image sensor is movable so as to facilitate image stabilization.

35. The miniature camera as recited in claim 24, wherein the first optical element comprises at least one lens and wherein the stage comprises bidirectional stage assemblies that facilitate image stabilization.

36. The miniature camera as recited in claim 24, wherein the first optical element comprises a lens that is integrated with the stage at a wafer level.

37. The miniature camera as recited in claim 24, wherein the optical element comprises at least one lens that is passively aligned to the stage via mating features of the lens and the stage.

38. The miniature camera as recited in claim 24, wherein the optical element comprises a mating feature and the stage comprises a complimentary mating feature.

39. The miniature camera as recited in claim 24, wherein the optical element comprises a mating feature that is generally square in crass section and the stage comprises a complimentary mating feature.

40. The miniature camera as recited in claim 24, further comprising at least one MEMS actuator configured to move the optical element and spring configured to provide a preload to the MEMS actuator.

41. The miniature camera as recited in claim 24, further comprising at least one stationary lens, disposed along an optical axis of the first optical element.

42. A miniature camera comprising:
 a stationary lens;
 a movable lens disposed generally along an optical axis of the stationary lens;
 a motion control assembly having a stage to which the movable lens is formed, wherein the motion control assembly is configured to provide movement of the stage in one degree of freedom while inhibiting movement of the stage in five degrees of freedom, so as to facilitate at least one of focusing and zooming the camera, the motion control assembly comprising:
 a substantially cruciform structure having a pair of bipod connecting elements; and,
 a secondary connecting element coupling intermediate point of the bipod connecting elements together.

43. The miniature camera as recited in claim 42, wherein the stage is movable to focus the camera.

44. The miniature camera as recited in claim 42, wherein the stage is moveable to zoom the camera.

45. The miniature camera as recited in claim 42, wherein the stage the stage is moveable to stabilize an image of the camera.

* * * * *